(12) United States Patent
Chang et al.

(10) Patent No.: US 11,581,416 B1
(45) Date of Patent: Feb. 14, 2023

(54) GATE STRUCTURES IN SEMICONDUCTOR DEVICES

(71) Applicant: Taiwan Semiconductor Manufacturing Co., Ltd., Hsinchu (TW)

(72) Inventors: Hsiang-Pi Chang, New Taipei (TW); Chung-Liang Cheng, Changhua County (TW); I-Ming Chang, Shinchu (TW); Yao-Sheng Huang, Kaohsiung (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/406,879

(22) Filed: Aug. 19, 2021

(51) Int. Cl.
*H01L 29/51* (2006.01)
*H01L 29/78* (2006.01)
*H01L 21/3115* (2006.01)
*H01L 21/8234* (2006.01)
*H01L 29/40* (2006.01)

(52) U.S. Cl.
CPC ........ *H01L 29/513* (2013.01); *H01L 21/3115* (2013.01); *H01L 21/823462* (2013.01); *H01L 29/401* (2013.01); *H01L 29/7851* (2013.01)

(58) Field of Classification Search
CPC ............... H01L 29/513; H01L 21/3115; H01L 21/823462; H01L 29/401; H01L 29/7851
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

(Continued)

FOREIGN PATENT DOCUMENTS

DE 102019129773 A1 * 5/2021 ....... H01L 21/02172

*Primary Examiner* — Earl N Taylor
(74) *Attorney, Agent, or Firm* — Sterne, Kessler, Goldstein & Fox P.L.L.C.

(57) ABSTRACT

A semiconductor device with different configurations of gate structures and a method of fabricating the same are disclosed. The method includes forming a fin structure on a substrate, forming a gate opening on the fin structure, forming an interfacial oxide layer on the fin structure, forming a first dielectric layer over the interfacial oxide layer, forming a dipole layer between the interfacial oxide layer and the first dielectric layer, forming a second dielectric layer on the first dielectric layer, forming a work function metal (WFM) layer on the second dielectric layer, and forming a gate metal fill layer on the WFM layer. The dipole layer includes ions of first and second metals that are different from each other. The first and second metals have electronegativity values greater than an electronegativity value of a metal or a semiconductor of the first dielectric layer.

20 Claims, 23 Drawing Sheets

(56) References Cited

U.S. PATENT DOCUMENTS

| | | | |
|---|---|---|---|
| 2010/0099245 A1* | 4/2010 | Hyun | H01L 21/823842 |
| | | | 257/E21.409 |
| 2012/0049297 A1* | 3/2012 | Takeoka | H01L 29/517 |
| | | | 257/410 |
| 2017/0005175 A1* | 1/2017 | Song | H01L 27/085 |
| 2020/0119019 A1* | 4/2020 | Tsai | H01L 21/823821 |
| 2020/0135475 A1* | 4/2020 | Cheng | H01L 21/823842 |
| 2021/0134974 A1* | 5/2021 | More | H01L 21/28088 |
| 2021/0375629 A1* | 12/2021 | Lai | H01L 21/31111 |
| 2022/0223695 A1* | 7/2022 | More | H01L 29/401 |

* cited by examiner

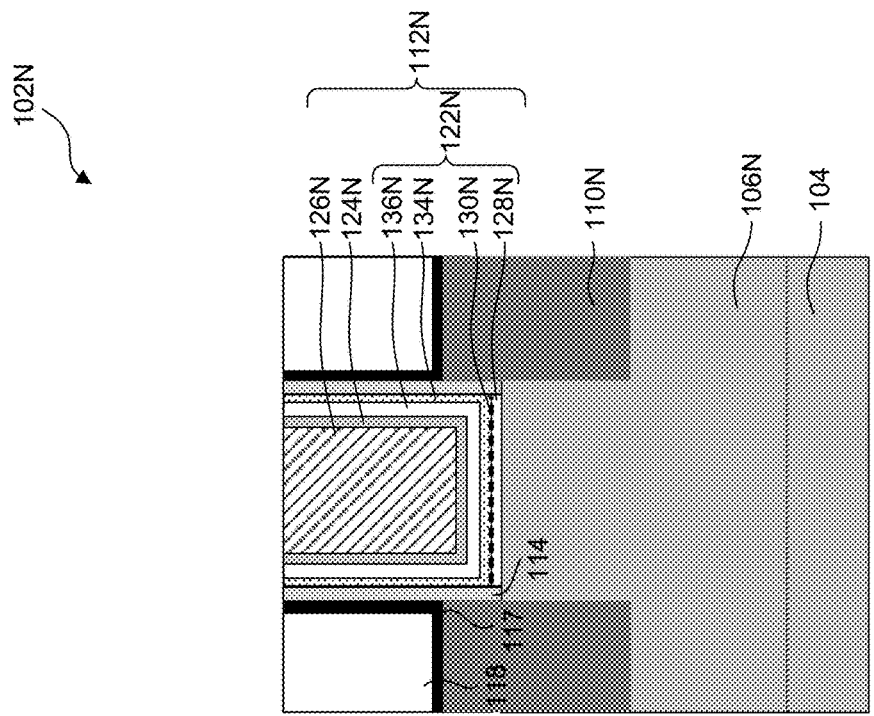
Fig. 1C
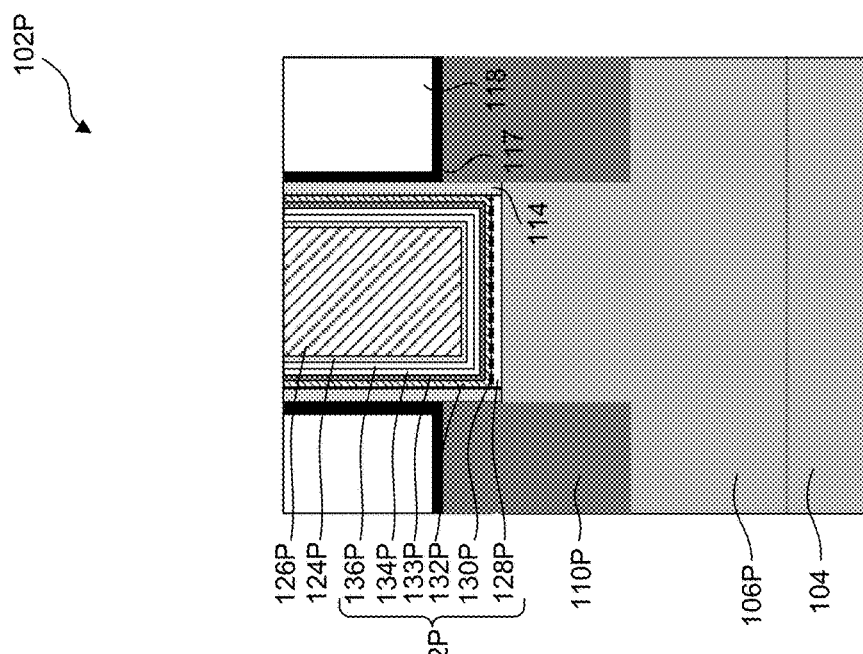
Fig. 1B

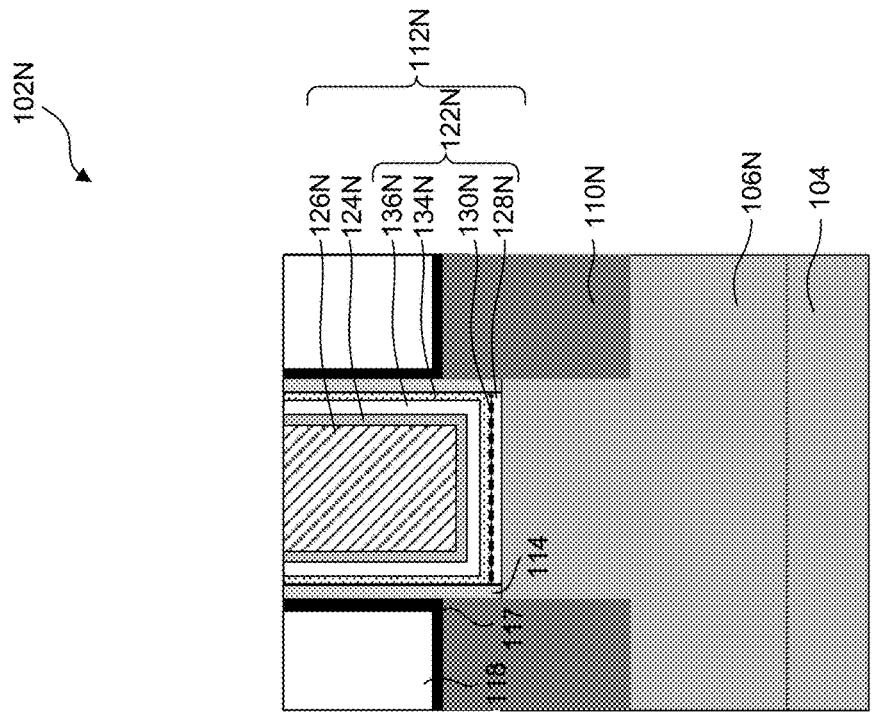
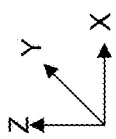
Fig. 1E
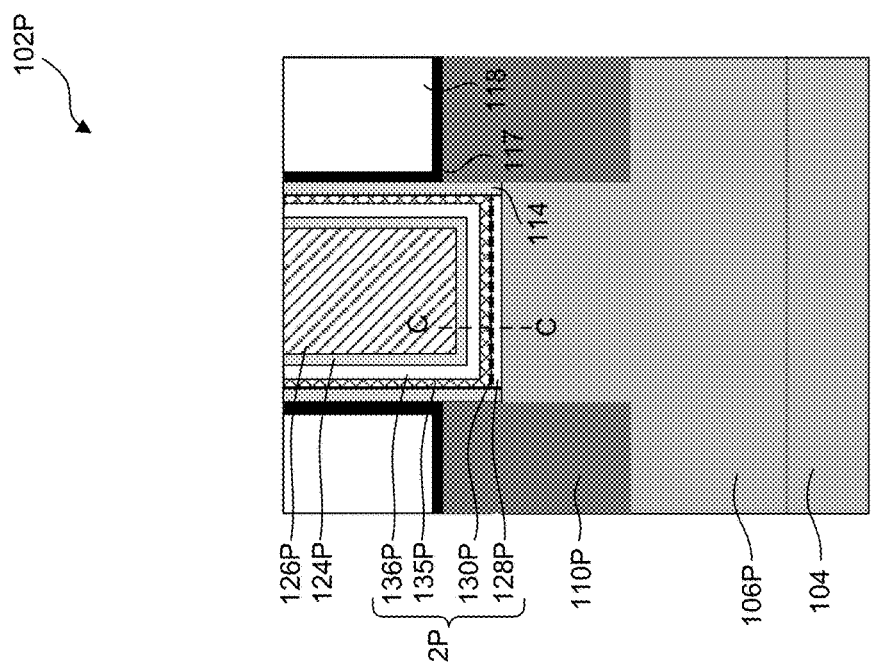
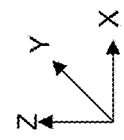
Fig. 1D

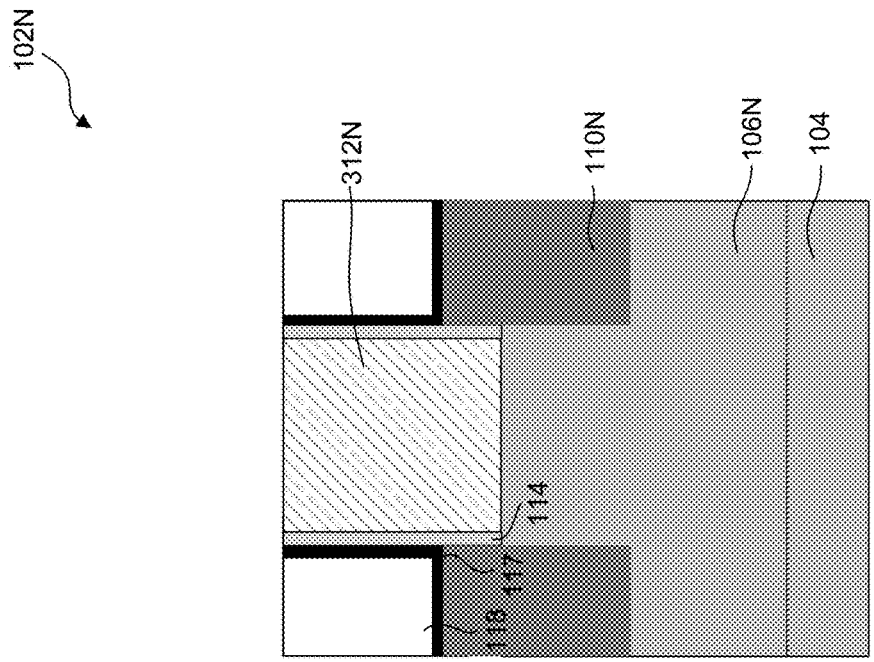
Fig. 3B
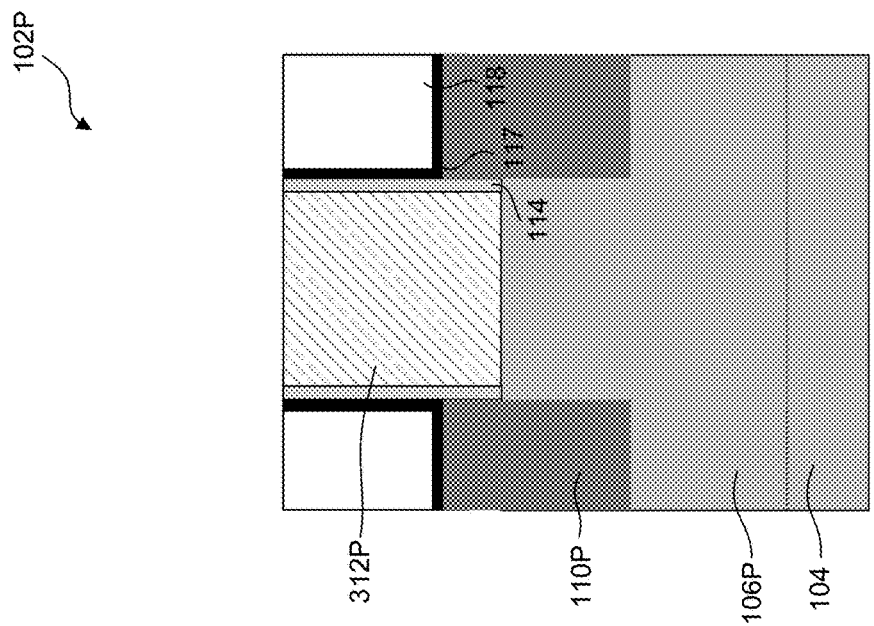
Fig. 3A

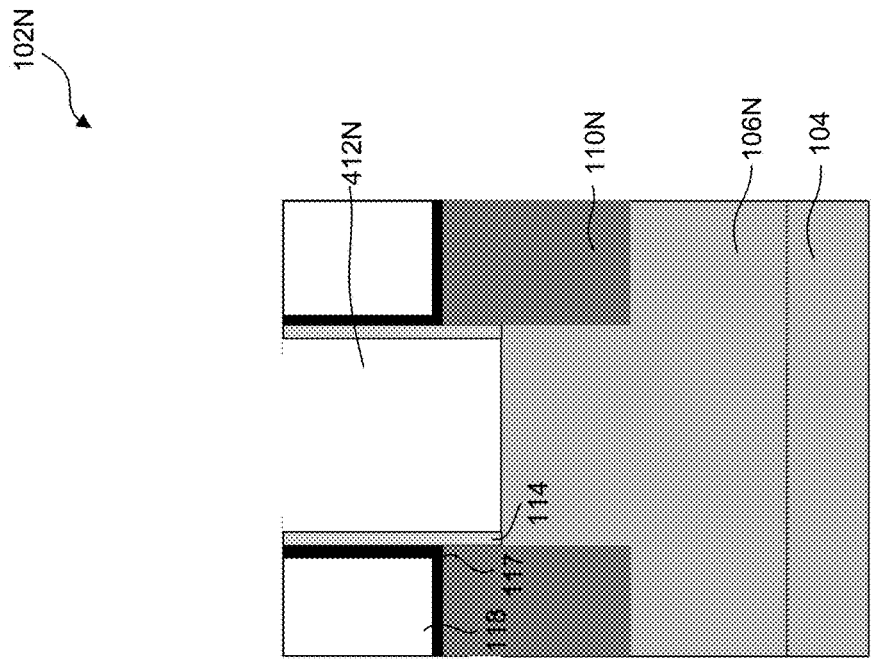
Fig. 4B
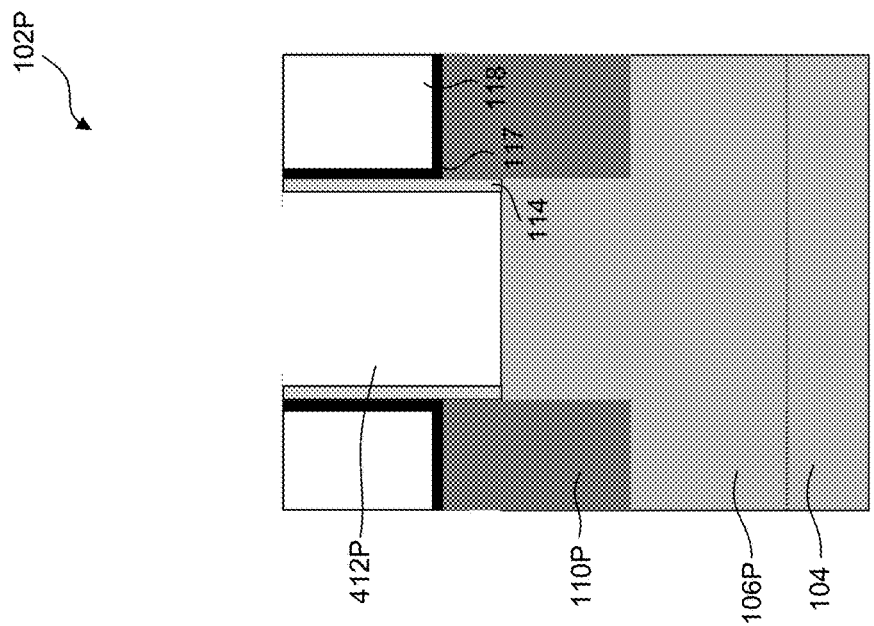
Fig. 4A

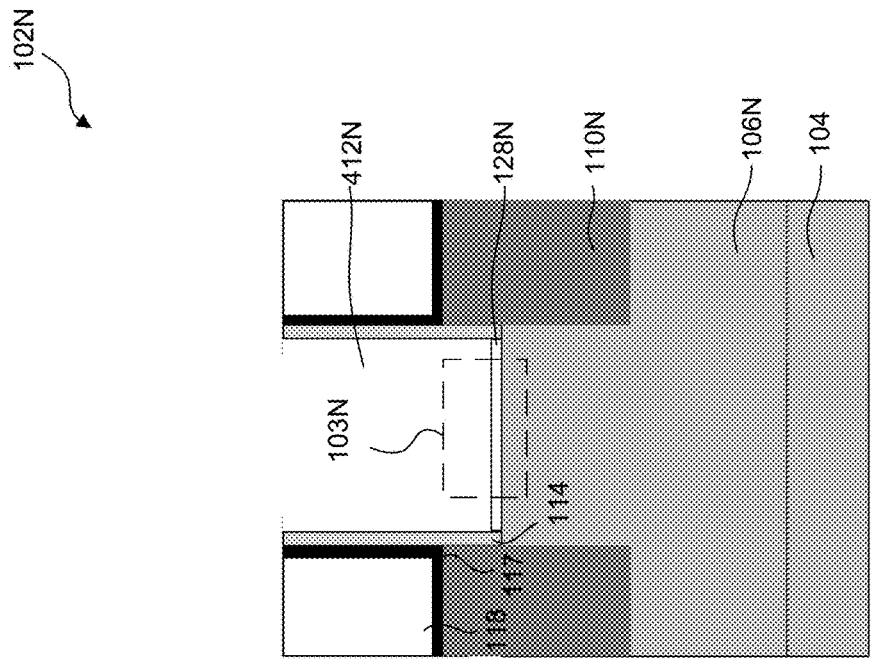
Fig. 5B
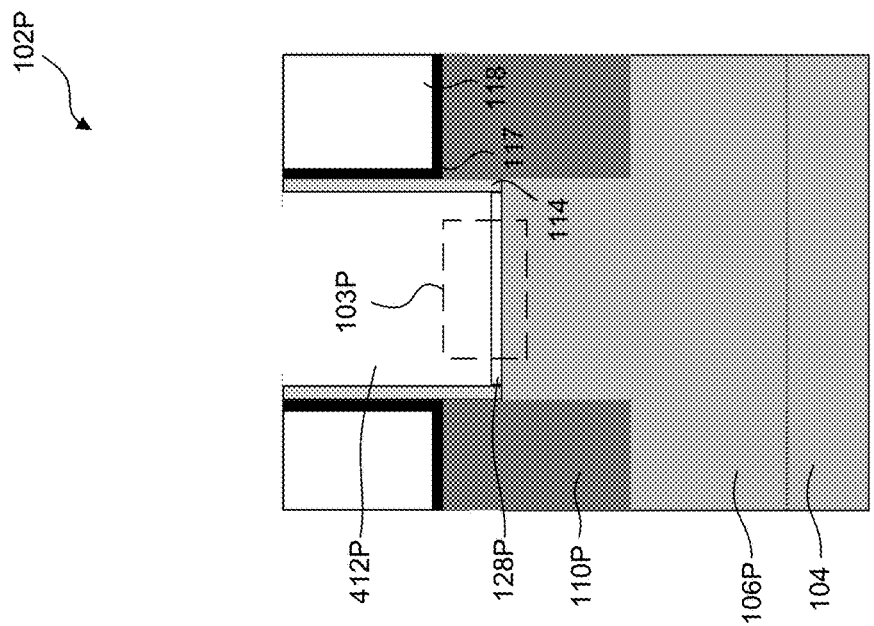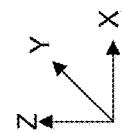
Fig. 5A

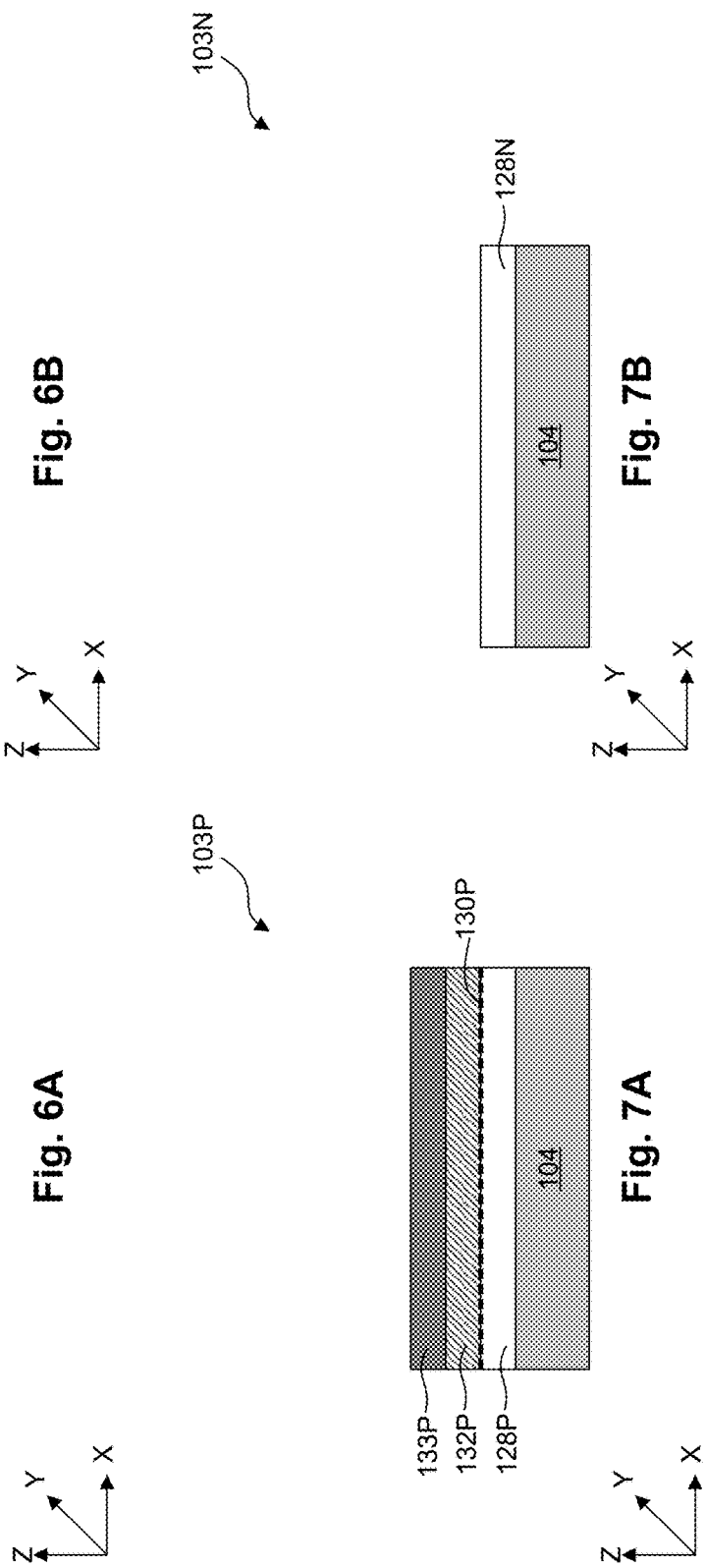
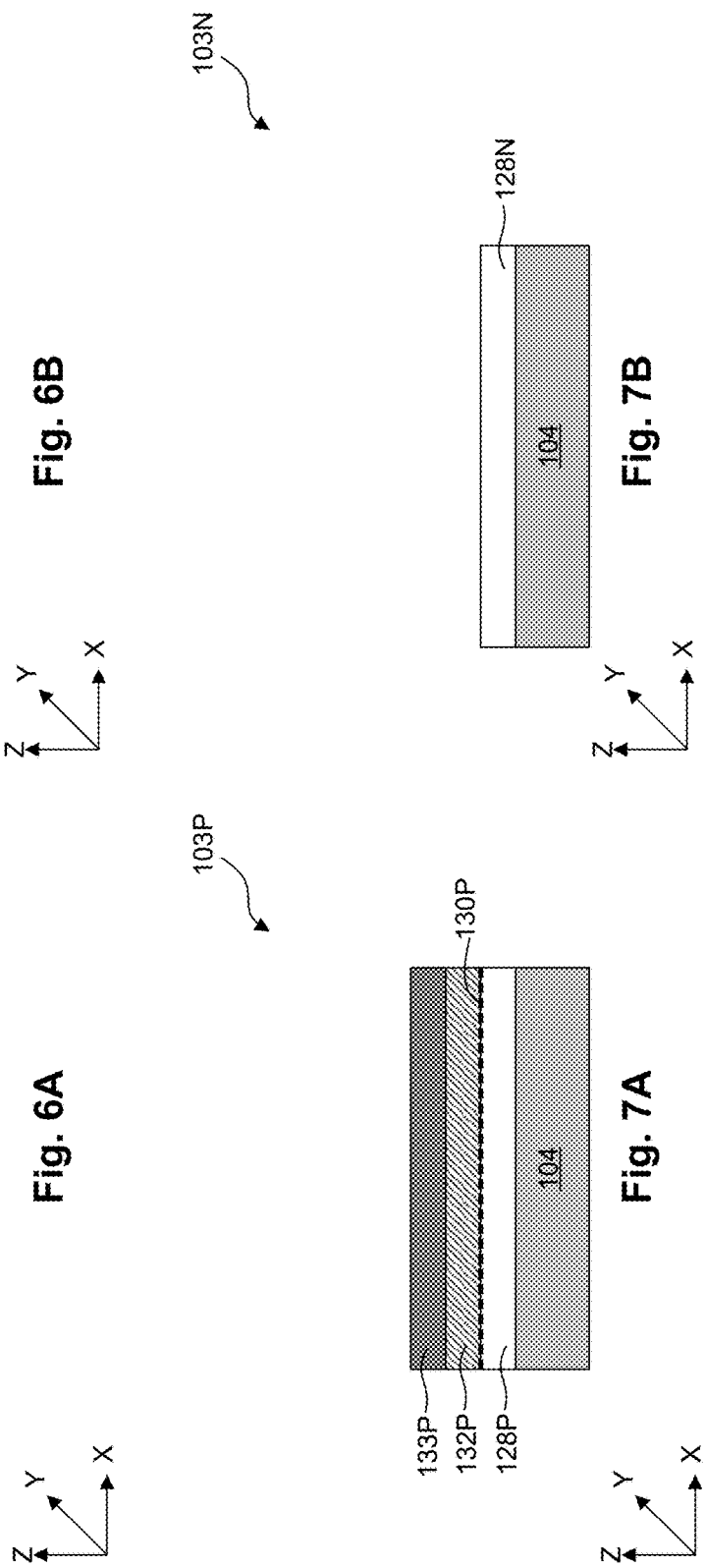

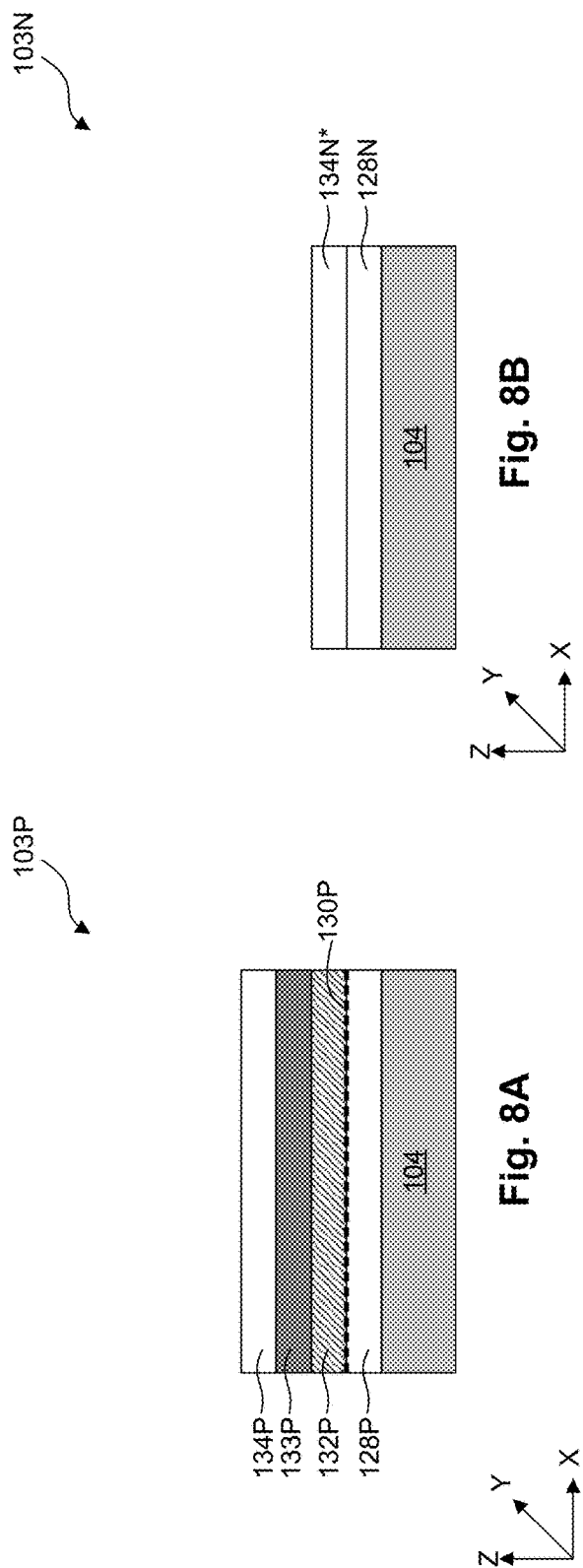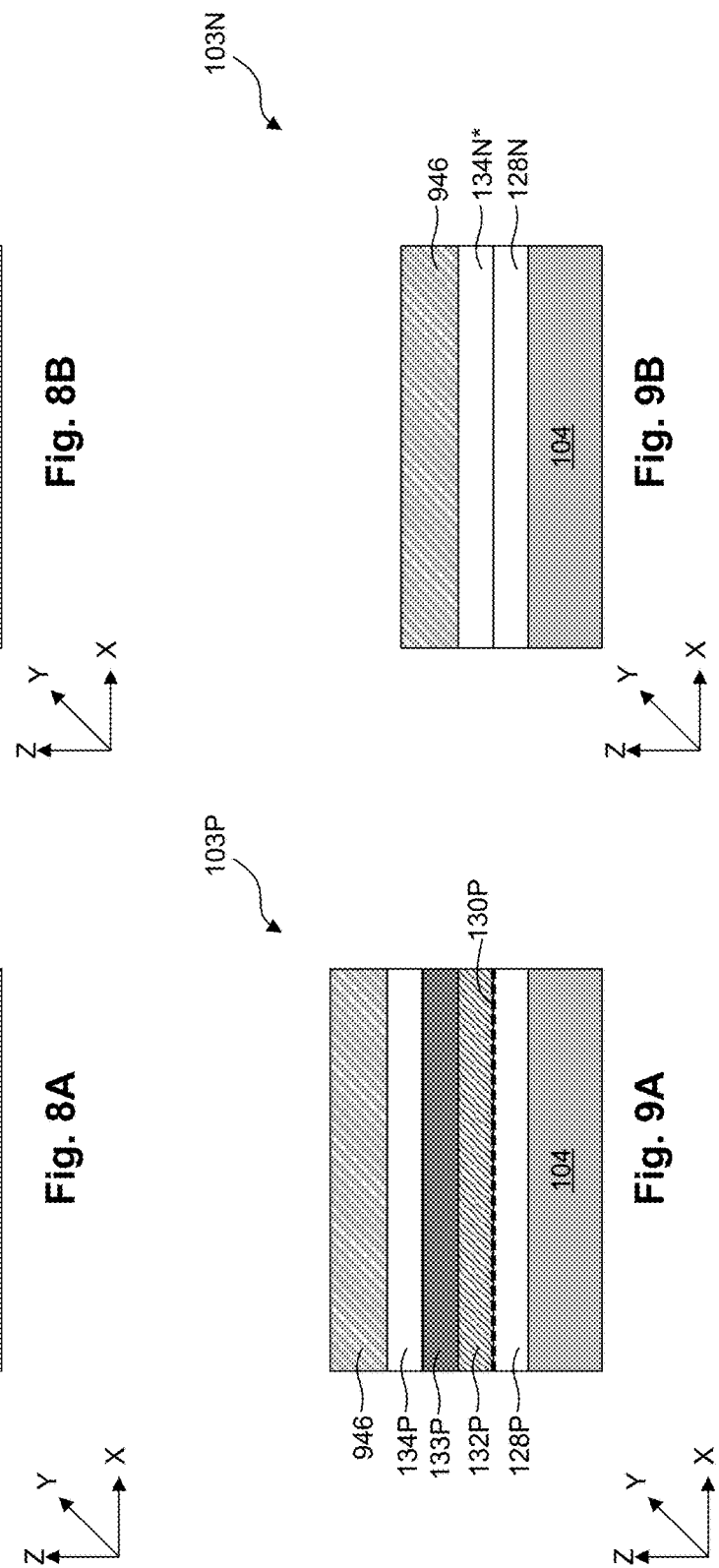

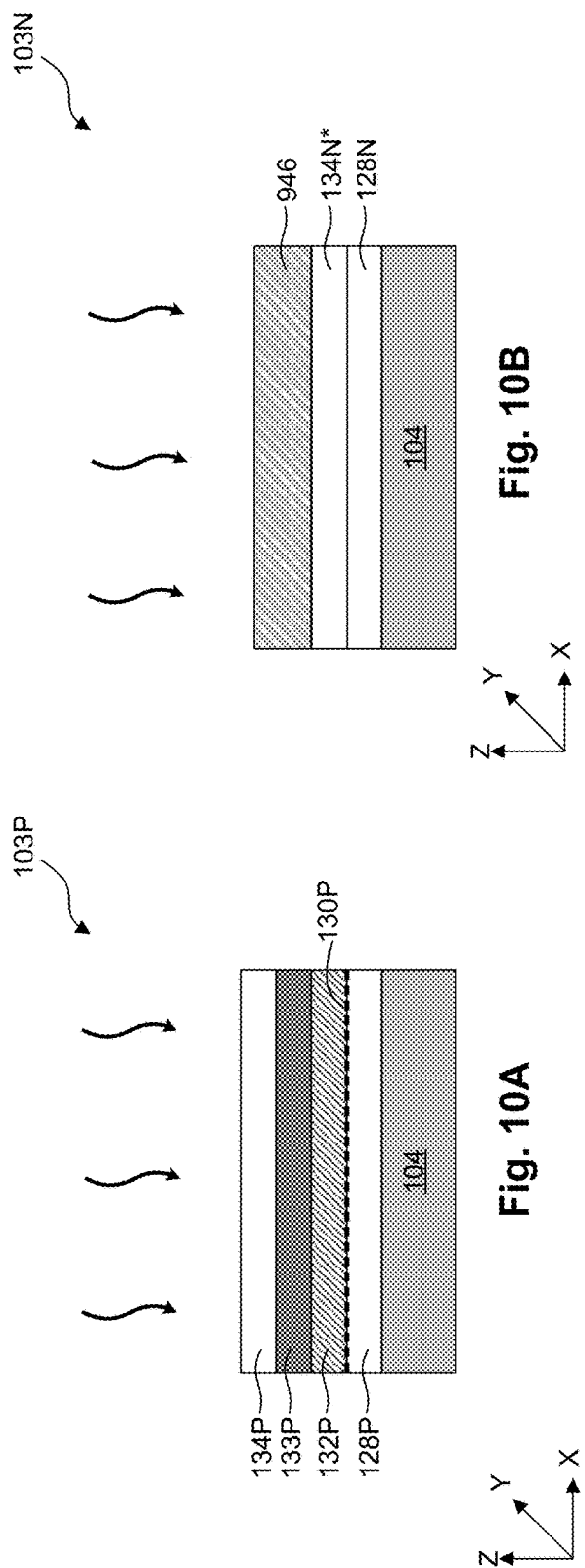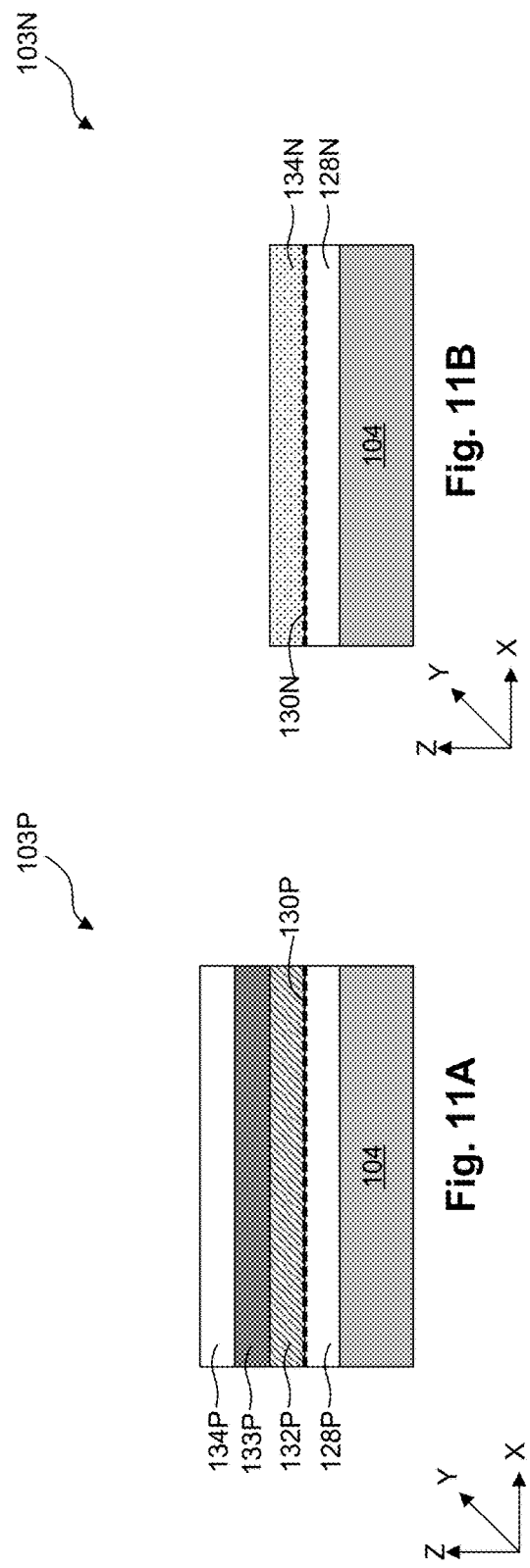

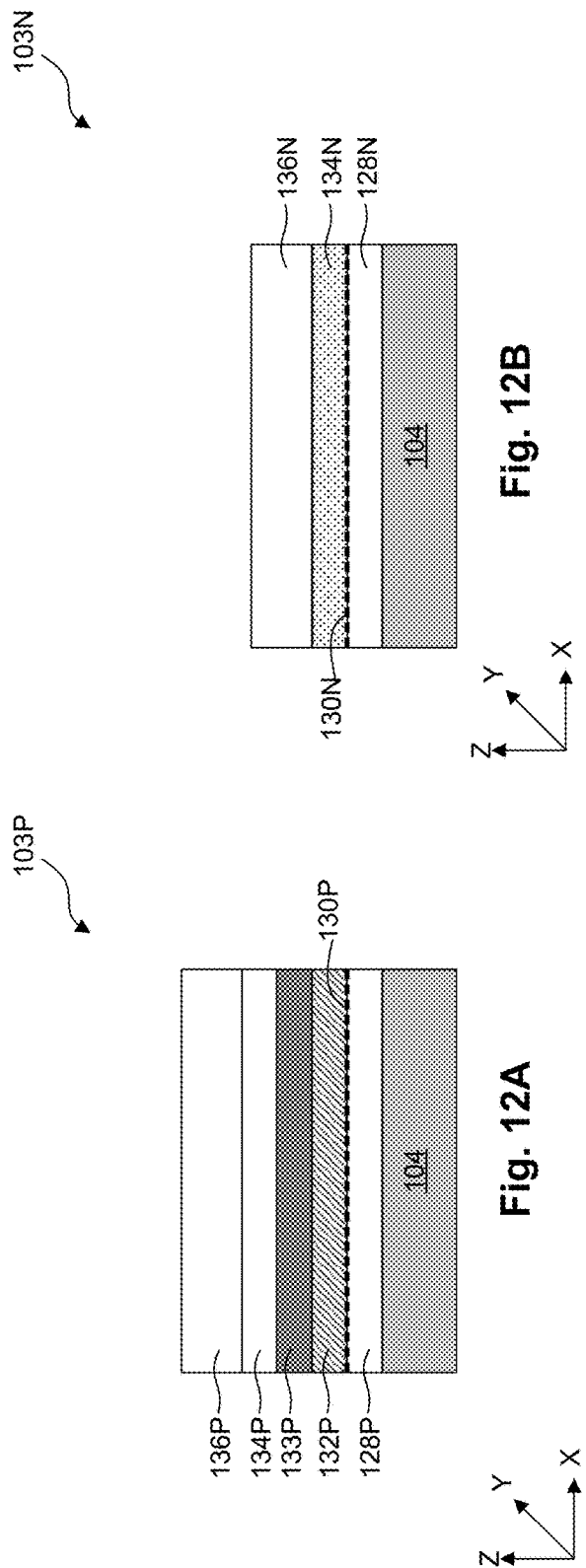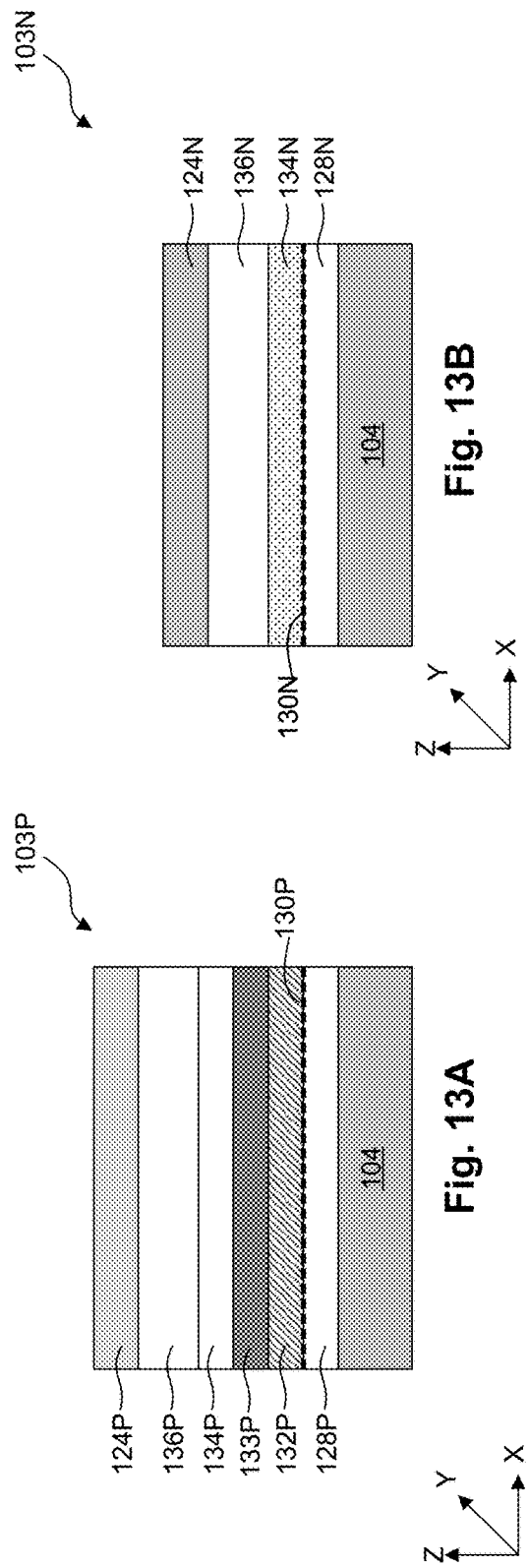

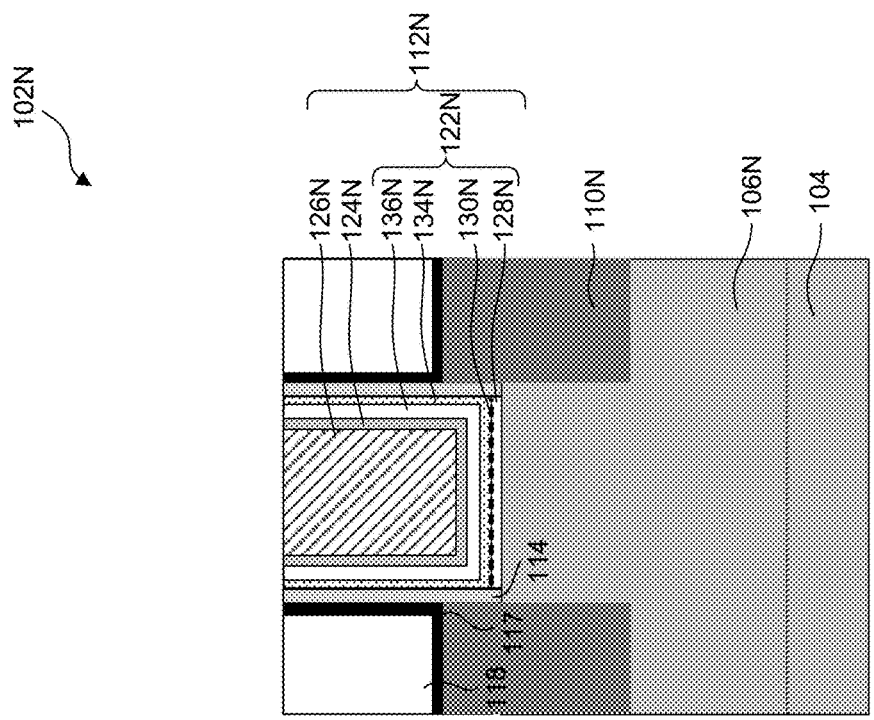
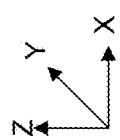
Fig. 15B
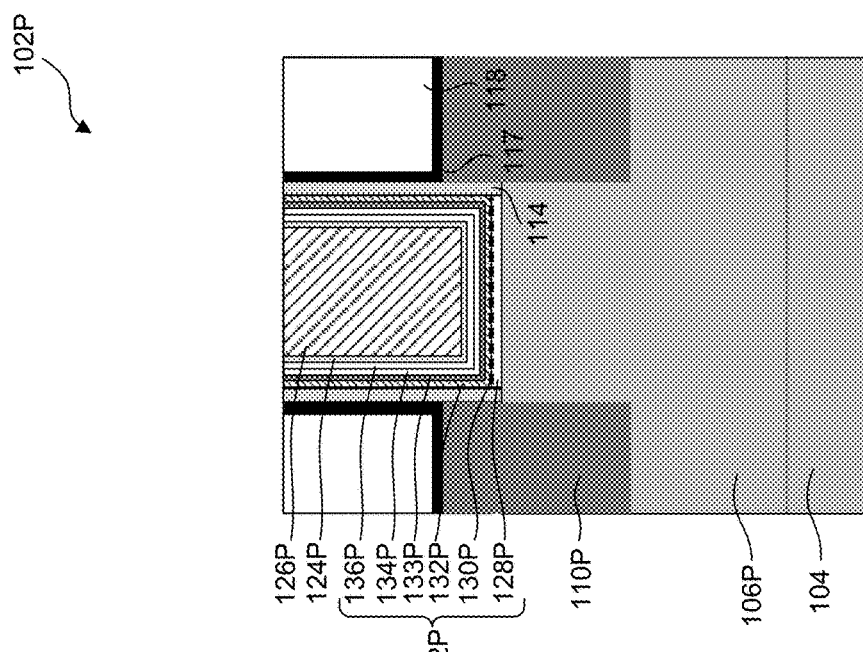
Fig. 15A

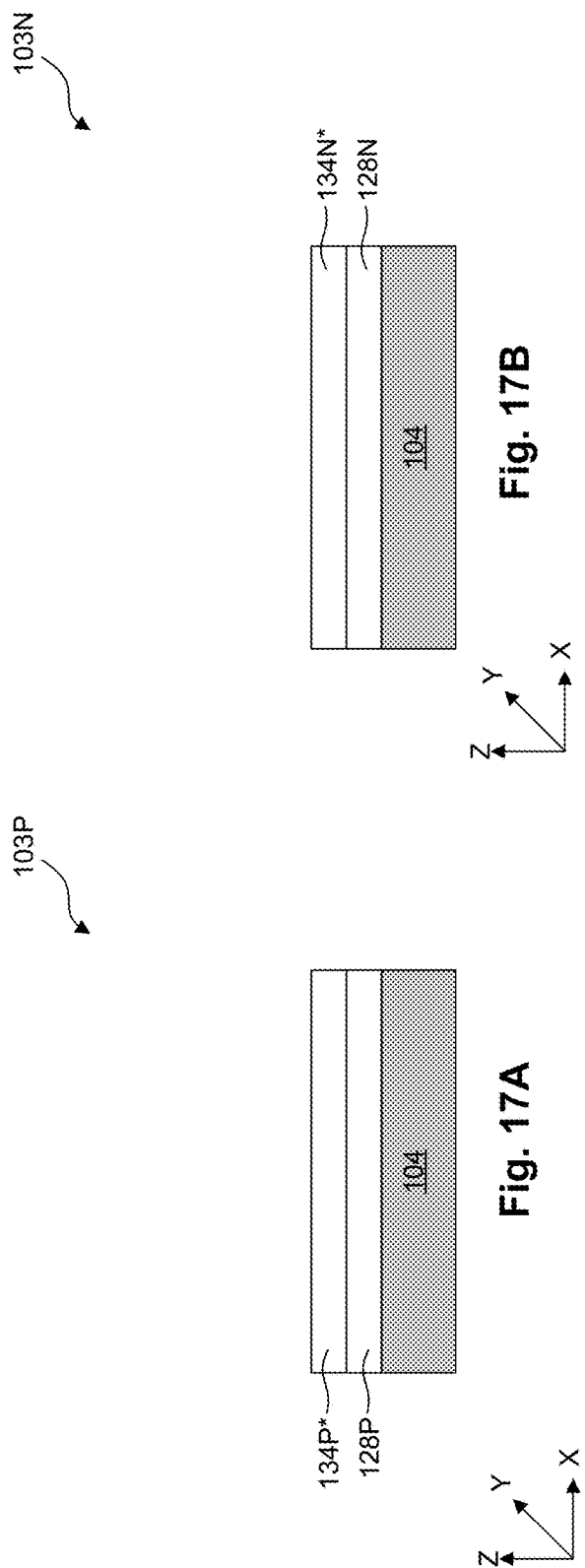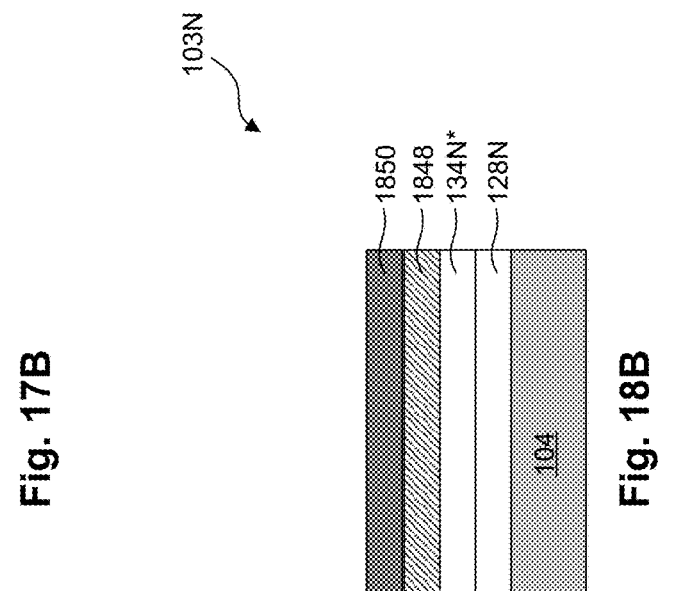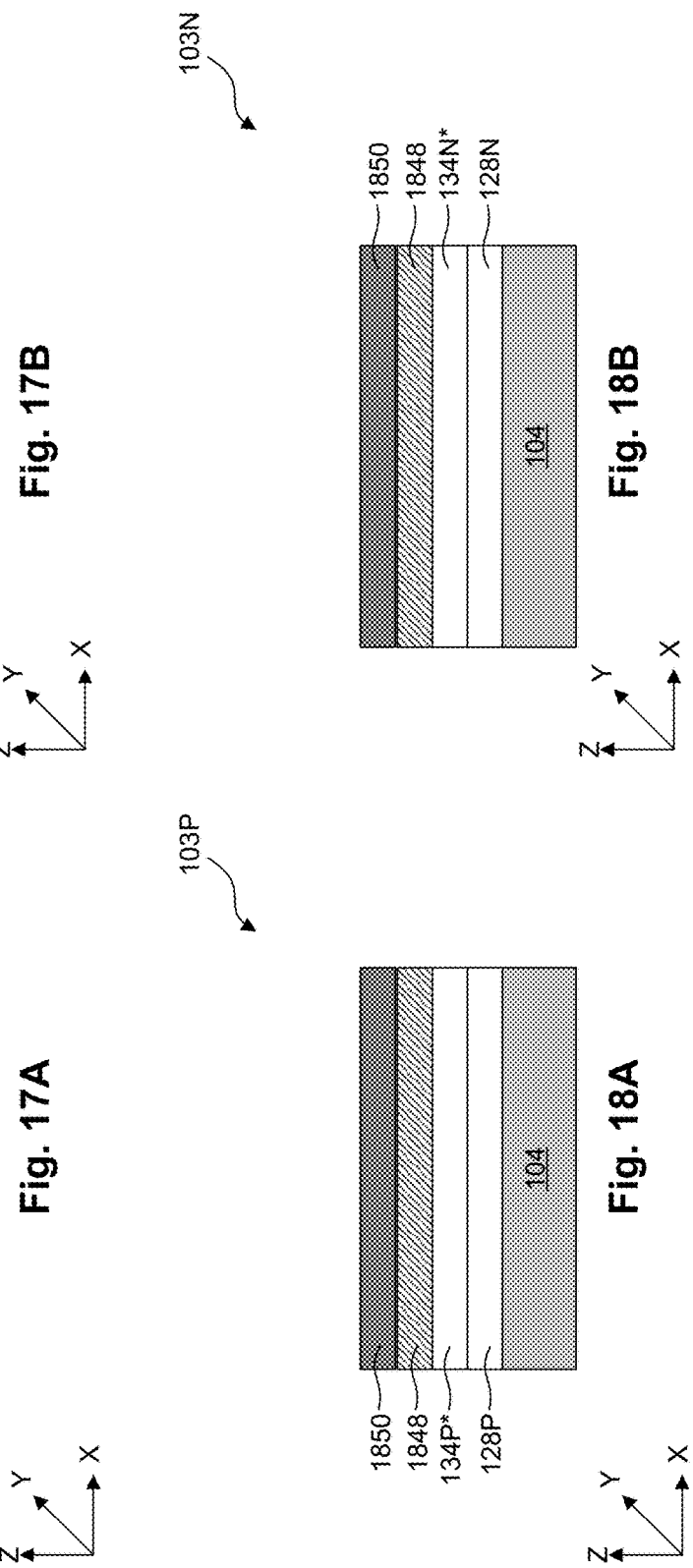

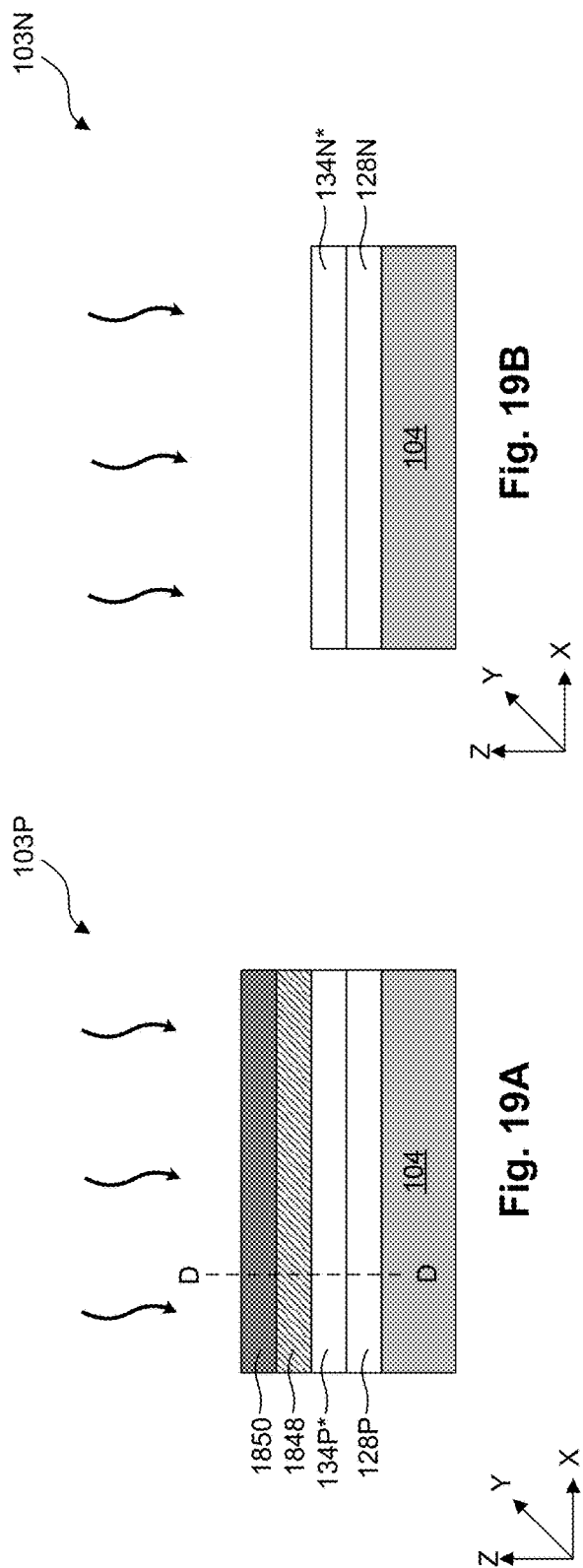
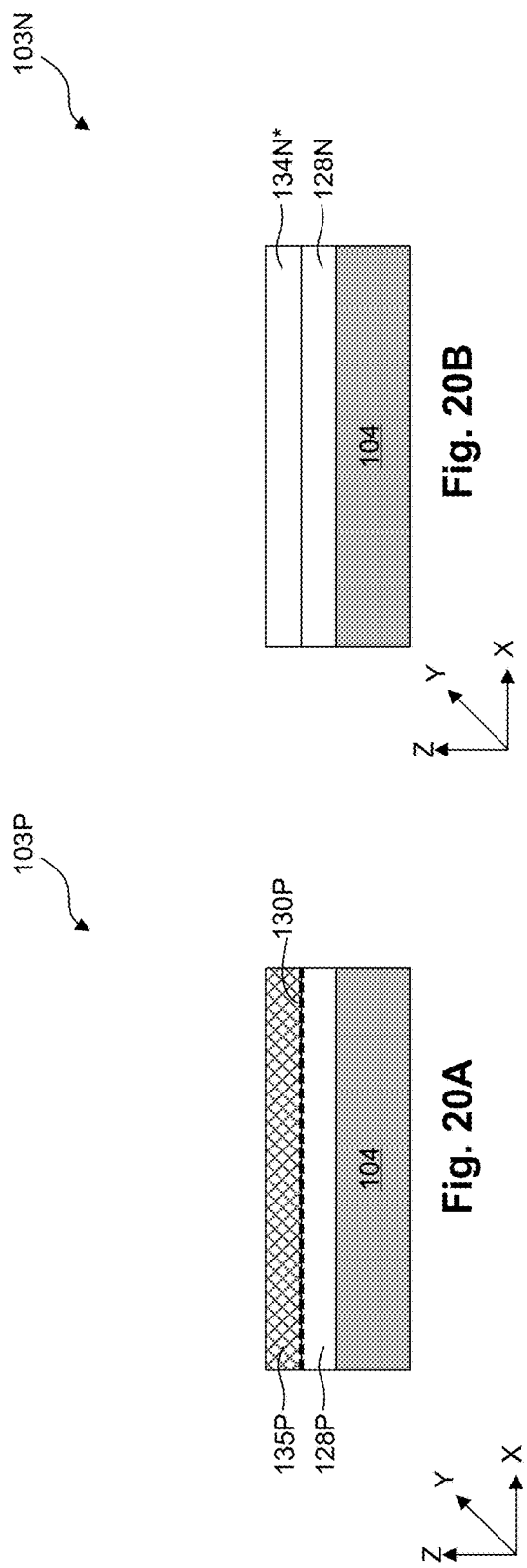

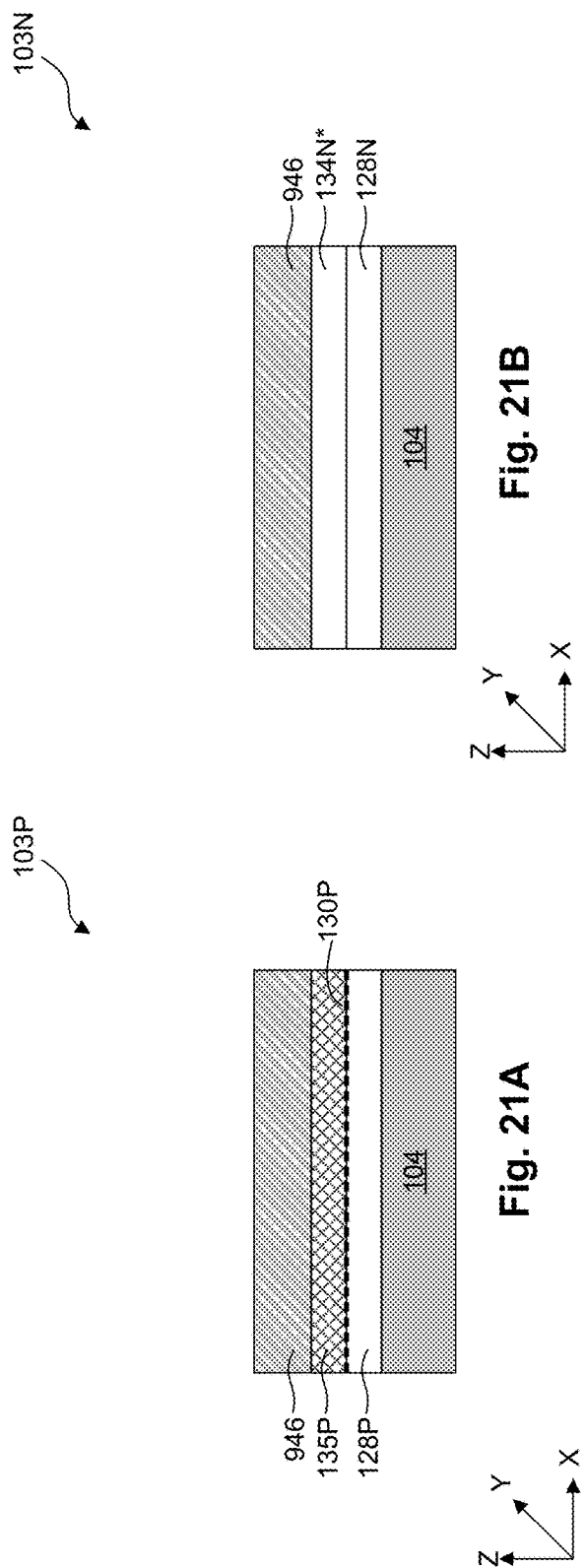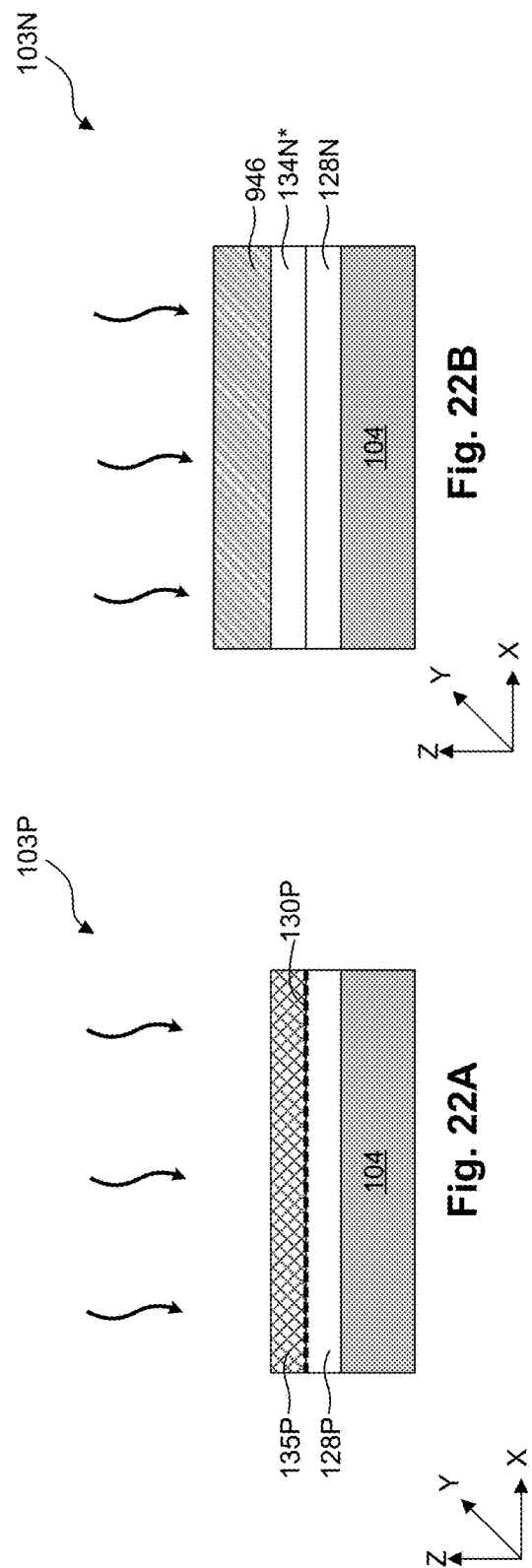

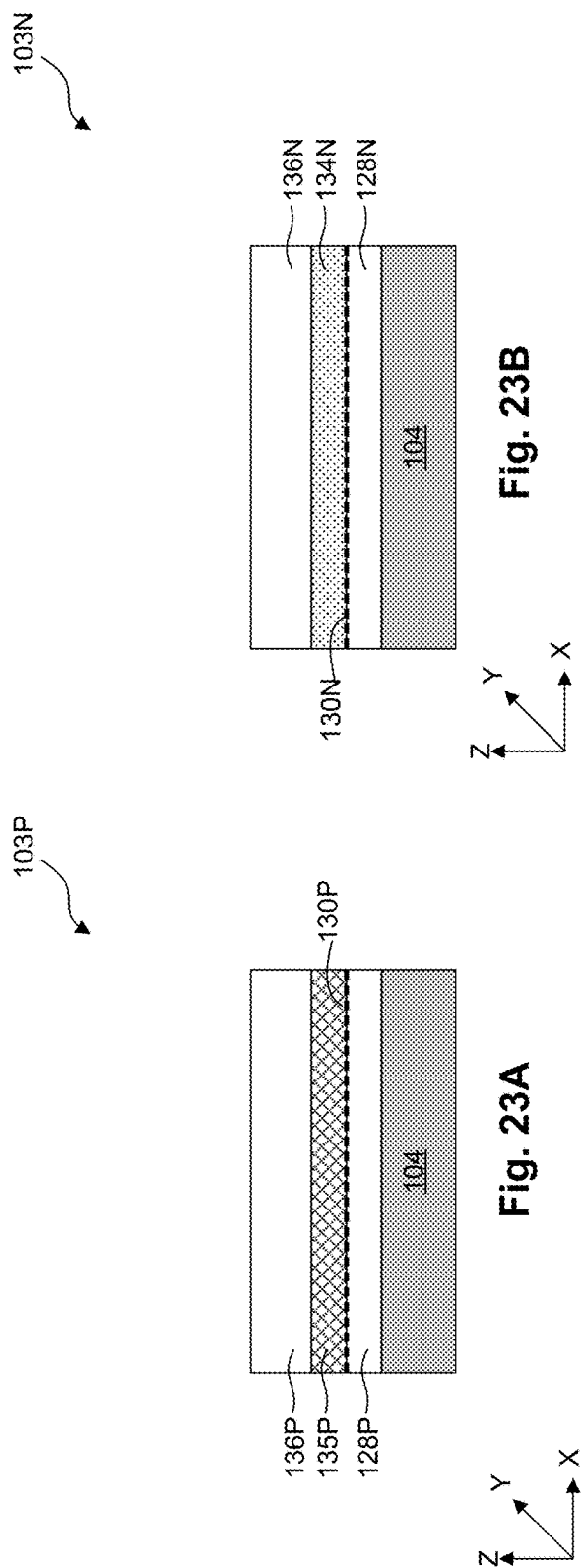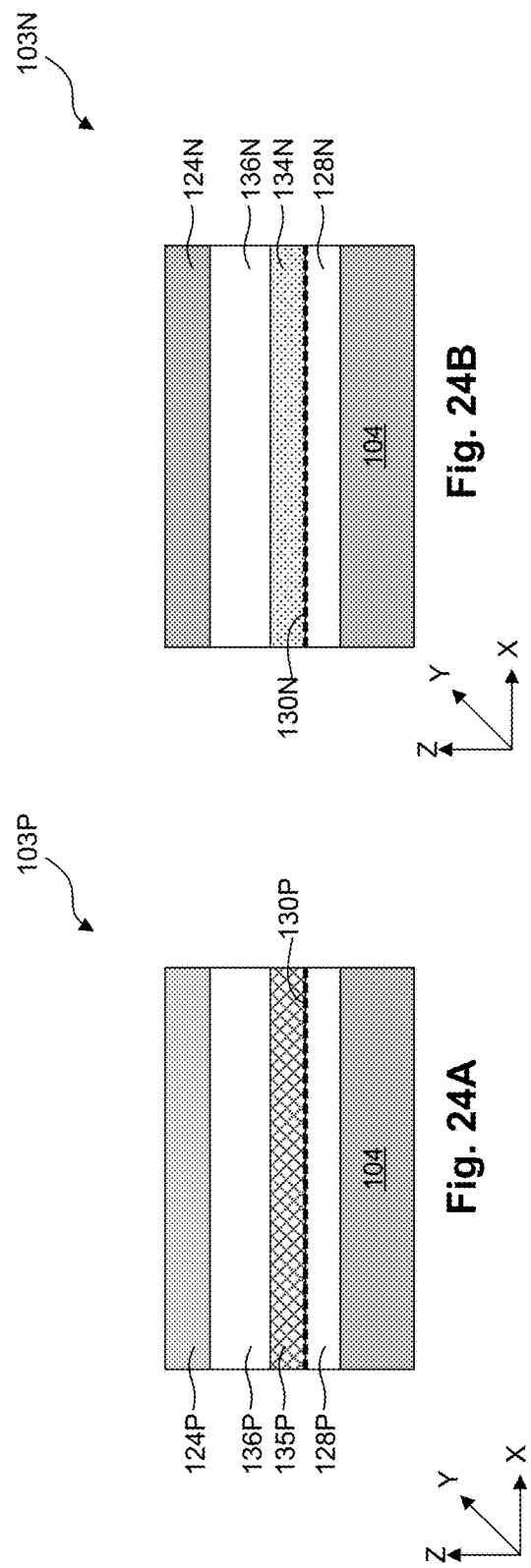

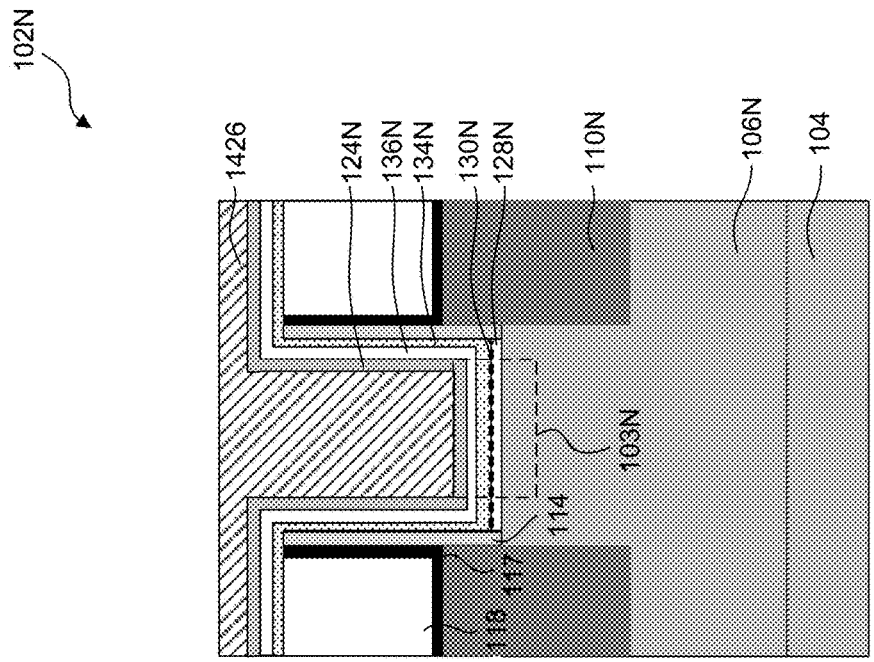
Fig. 25B
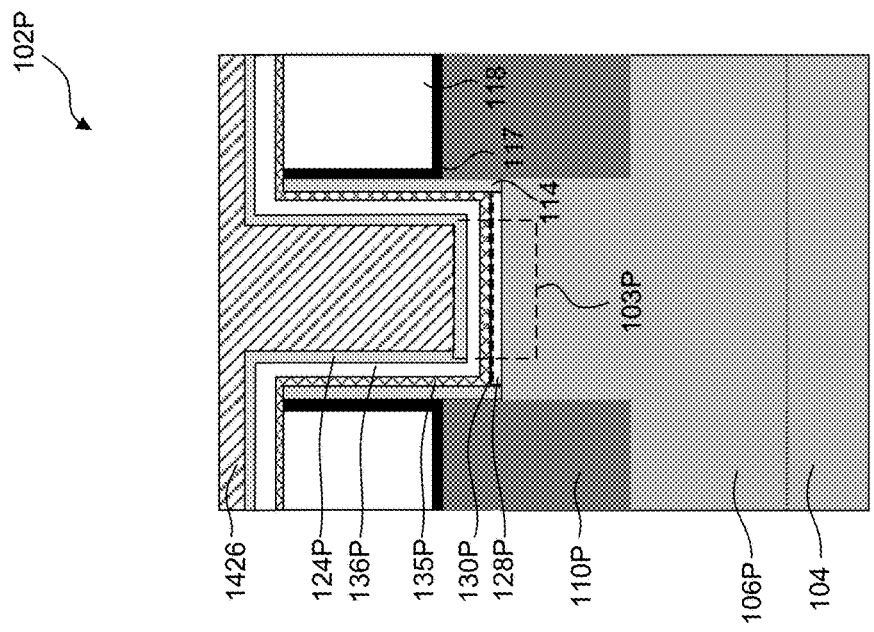
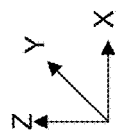
Fig. 25A

GATE STRUCTURES IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1B-1E illustrate cross-sectional views of a semiconductor device with different gate structures, in accordance with some embodiments.

FIGS. 3A-15B illustrate cross-sectional views of a semiconductor device with different gate structures at various stages of its fabrication process, in accordance with some embodiments.

FIGS. 17A-26B illustrate cross-sectional views of a semiconductor device with different gate structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
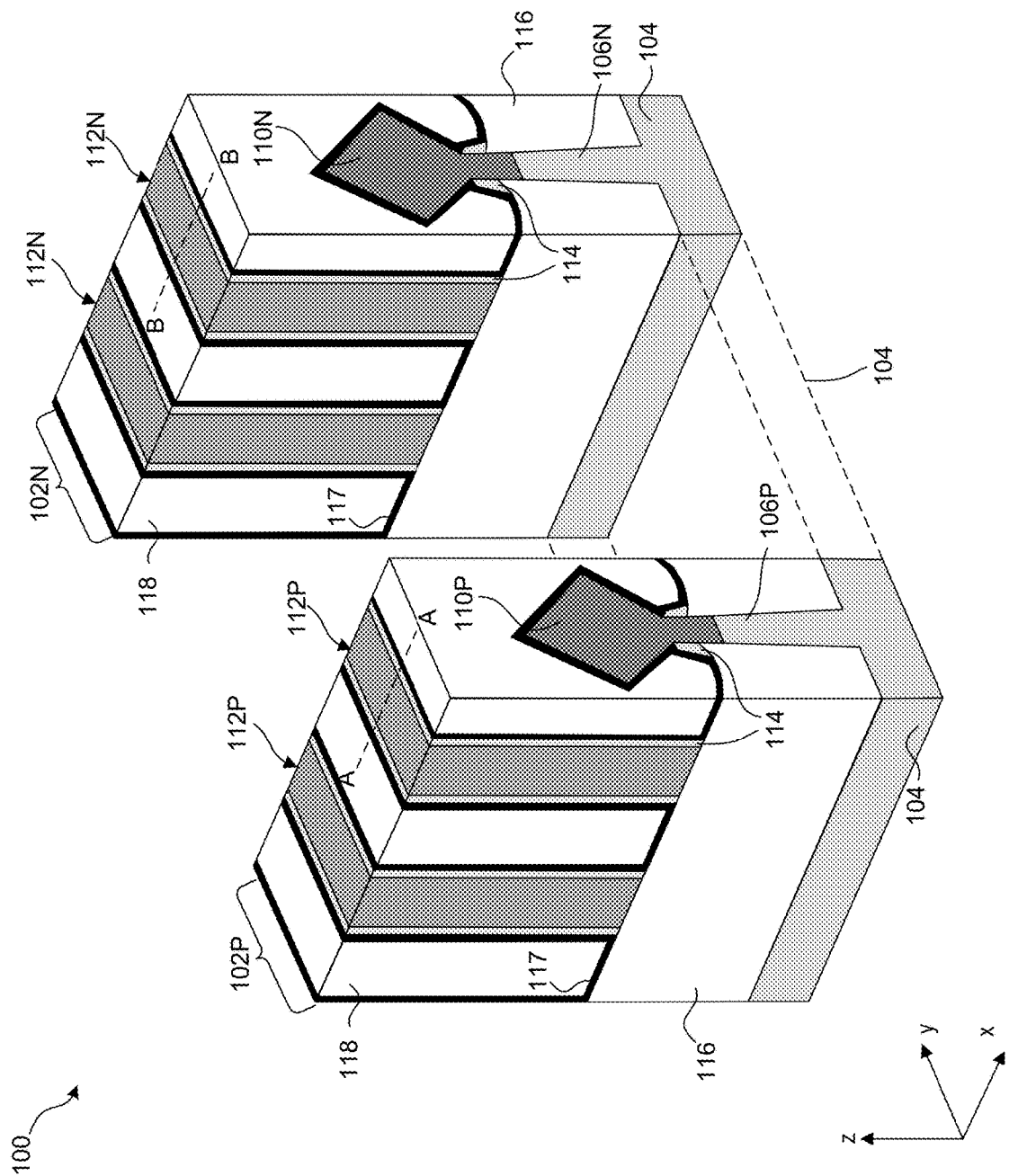
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of each of the layers of the FET gate structure. As such, FETs can be manufactured with different threshold voltages by adjusting the thickness and/or material composition of the FET gate structures.

Due to the increasing demand for multi-functional low power portable devices, there is an increasing demand for FETs with lower and/or different threshold voltages, such as threshold voltages lower than 100 mV. One way to achieve multi-Vt devices with low threshold voltages in FETs can be with different work function metal (WFM) layer thicknesses greater than about 4 nm (e.g., about 5 nm to about 10 nm) in the gate structures. However, the different WFM layer thicknesses can be constrained by the FET gate structure geometries. Also, depositing different WFM layer thicknesses can become increasingly challenging with the continuous scaling down of FETs (e.g., GAA FETs, finFETs, and/or MOSFETs).

The present disclosure provides example multi-Vt devices with FETs (e.g., finFETs) having ultra-low threshold voltages (e.g., about 20 mV to about 100 mV) different from each other and provides example methods of forming such FETs on the same substrate. The example methods form NFETs and PFETs with WFM layer of similar thicknesses, but with ultra-low and/or different threshold voltages, on the same substrate. These example methods can be more cost-effective (e.g., cost reduced by about 20% to about 30%) and time-efficient (e.g., time reduced by about 15% to about 20%) in manufacturing reliable FET gate structures with lower and/or different threshold voltages than other methods of forming FETs with similar dimensions and threshold voltages on the same substrate. In addition, these example methods can form FET gate structures with much smaller dimensions (e.g., thinner gate stacks) than other methods of forming FETs with similar threshold voltages.

In some embodiments, NFETs and PFETs with different gate structure configurations, but with similar WFM layer thicknesses, can be selectively formed on the same substrate to achieve ultra-low and/or different threshold voltages. The different gate structures can have high-K (HK) gate dielectric layers doped with different metallic dopants. The different metal dopants can induce dipoles of different polarities and/or concentrations at interfaces between the HK gate dielectric layers and interfacial oxide (TO) layers. The dipoles of different polarities and/or concentrations result in gate structures with different EWF values and threshold voltages. In some embodiments, HK gate dielectric layers can be doped with dopants of two different materials to induce dipoles of different materials that provide stronger electric fields and lower threshold voltages. Thus, controlling the dopant materials and/or concentrations in the HK gate dielectric layers can tune the EWF values of the NFET and PFET gate structures, and as a result can adjust the threshold voltages of the NFETs and PFETs without varying the WFM layer thicknesses. In some embodiments, instead of the doped HK gate dielectric layer, PFET gate structure can include dual metal oxide layers interposed between the HK gate dielectric and the IO layer to induce dipoles of different materials between the HK gate dielectric layer and the IO layer.

FIG. 1A illustrates an isometric view of a semiconductor device 100 with PFET 102P and NFET 102N, according to some embodiments. PFET 102P and NFET 102N can have different cross-sectional views, as illustrated in FIGS. 1B-1E, according to various embodiments. FIGS. 1B-1E illustrate cross-sectional views of PFET 102P and NFET 102N along respective lines A-A and B-B of FIG. 1A. FIGS. 1B-1E illustrate cross-sectional views of semiconductor device 100 with additional structures that are not shown in FIG. 1A for simplicity. The discussion of elements of PFET 102P and NFET 102N with the same annotations applies to each other, unless mentioned otherwise.

Referring to FIG. 1A, NFET 102N can include an array of gate structures 112N disposed on fin structure 106N, and PFET 102P can include an array of gate structures 112P disposed on fin structure 106P. NFET 102N can further include an array of S/D regions 110N disposed on portions of fin structure 106N that are not covered by gate structures 112N. Similarly, PFET 102P can further include an array of epitaxial S/D regions 110P disposed on portions of fin structure 106P that are not covered by gate structures 112P.

Semiconductor device 100 can further include gate spacers 114, shallow trench isolation (STI) regions 116, etch stop layers (ESLs) 117, and interlayer dielectric (ILD) layers 118. In some embodiments, gate spacers 114, STI regions 116, ESLs 117, and ILD layers 118 can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112N and 112P from adjacent structures.

Semiconductor device 100 can be formed on a substrate 104 with PFET 102P and NFET 102N formed on different regions of substrate 104. There may be other FETs and/or structures (e.g., isolation structures) formed between PFET 102P and NFET 102N on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106P-106N can include a material similar to substrate 104 and extend along an X-axis.

Referring to FIGS. 1B-1C, PFET-NFET 102P-102N can include S/D regions 110P-110N and gate structures 112P-112N. For PFET 102P, S/D regions 110P can include an epitaxially-grown semiconductor material, such as Si and SiGe, and p-type dopants, such as boron and other suitable p-type dopants. For NFET 102N, S/D regions 110N can include an epitaxially-grown semiconductor material, such as Si, and n-type dopants, such as phosphorus and other suitable n-type dopants.

Gate structures 112P-112N can be multi-layered structures. Gate structures 112P-112N can include (i) gate oxide structures 122P-122N disposed on respective fin structures 106P-106N, (ii) work function metal (WFM) layers 124P-124N disposed on respective gate oxide structures 122P-122N, and (iii) gate metal fill layers 126P-126N disposed on respective WFM layers 124P-124N.

Referring to FIG. 1B, in some embodiments, gate oxide structure 122P can include (i) an IO layer 128P disposed on fin structure 106P, (ii) a first metal oxide layer 132P disposed on IO layer 128P, (iii) a second metal oxide layer 133P disposed on first metal oxide layer 132P, (iv) a dipole layer 130P disposed at an interface between IO layer 128P and first metal oxide layer 132P, (v) a first HK gate dielectric layer 134P disposed on second metal oxide layer 133P, and (vi) a second HK gate dielectric layer 136P disposed on first HK gate dielectric layer 134P.

IO layer 128P can include an oxide of the material of fin structure 106P, such as silicon oxide ($SiO_2$), silicon germanium oxide ($SiGeO_x$), and germanium oxide ($GeO_x$). The materials of first and second metal oxide layers 132P-133P are different from each other and can induce the formation of two different p-type dipoles in dipole layer 130P. Dipole layer 130P can include p-type dipoles of (i) first metal ions from first metal oxide layer 132P and oxygen ions from IO layer 128P and (ii) second metal ions from second metal oxide layer 133P and oxygen ions from IO layer 128P. The first metal ions are different from the second metal ions. First and second metal oxide layers 132P-133P can include oxides of metals that have electronegativity values greater than the electronegativity values of metals or semiconductors in first HK gate dielectric layer 134P. In addition, first and second metal oxide layers 132P-133P can include oxide materials that have oxygen areal densities greater than the oxygen areal densities of oxide materials in first HK gate dielectric layer 134P. As used herein, the term "oxygen areal density" of an oxide material refers to an atomic concentration of oxygen atoms per unit area of the oxide material.

The larger electronegativity values and oxygen areal densities of first and second metal oxide layers 132P-133P can induce stronger p-type dipoles in dipole layer 130P compared to dipoles induced at an interface between IO layer 128P and first HK gate dielectric layer 134P in the absence of first and second metal oxide layers 132P-133P. Also, the two different p-type dipoles can generate a stronger electric field than single p-type dipoles and form a more stable dipole layer 130P. As stronger p-type dipoles can result in lower threshold voltages for PFETs, the use of first and second metal oxide layers 132P-133P can form PFET 102P with a threshold voltage lower than about 100 mV (e.g., about 50 mV, about 30 mV, or about 20 mV).

In some embodiments, first and second metal oxide layers 132P-133P can include oxides of transition metals, such as zinc oxide ($ZnO_2$), niobium oxide ($NbO_2$), molybdenum oxide ($MoO_2$), tungsten oxide ($WO_3$), and tantalum oxide ($Ta_2O_5$). In some embodiments, first and second metal oxide layers 132P-133P can include oxides of elements from group 13 of the periodic table, such as gallium oxide ($Ga_2O_3$), aluminum oxide ($Al_2O_3$), and indium oxide ($In_2O_3$), when first HK gate dielectric layer 134P includes $HfO_2$. In some embodiments, first metal oxide layer 132P can include an oxide of a transition metal and second metal oxide layer 133P can include an oxide of a material from group 13 of the periodic table. In some embodiments, dipole layer 130P can include Ga—O and Zn—O dipoles when first metal oxide layer 132P includes ZnO and second metal oxide layer 133P includes $Ga_2O_3$.

In some embodiments, dipole layer 130P can have a higher concentration of transition metal based dipoles (e.g., Zn—O, Nb—O, Mo—O, W—O, or Ta—O) than group 13 element based dipoles (e.g., Ga—O, Al—O, or In—O) to achieve threshold voltages below about 50 mV (e.g., about 30 mV or 20 mV). In such embodiments, first metal oxide layer 132P includes a transition metal oxide with a thickness greater than the thickness of second metal oxide 133P that includes an oxide of group 13 element as the concentration of dipoles is directly proportional to the thickness of the dipole source layer. In contrast, to achieve threshold voltages greater than 50 mV (e.g. about 70 mV or about 100 mV), dipole layer 130P can have a higher concentration of group 13 element based dipoles than transition metal based dipoles. In such embodiments, first metal oxide layer 132P includes an oxide of group 13 element with a thickness greater than the thickness of second metal oxide 133P that includes a transition metal oxide. In some embodiments, first metal oxide layer 132P can include oxides of transition metals and dipole layer 130P can include transition metal based dipoles in the absence of second metal oxide layer 133P.

In some embodiments, first and second metal oxide layers 132P-133P can have thicknesses ranging from about 0.5 nm to about 3 nm. If first and second metal oxide layers 132P-133P are thinner than about 0.5 nm, the formation of dipoles in dipole layer 130P may not occur. On the other hand, if first and second metal oxide layers 132P-133P are thicker than 3 nm, diffusion of metal atoms from first and second metal oxide layers 132P-133P may degrade first and second HK gate dielectric layers 134P-136P, and consequently degrade device performance.

First and second HK gate dielectric layers 134P-136P can include high-k dielectric materials, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, first and second HK gate dielectric layers 134P-136P can include materials similar to or different from each other. In some embodiments, first and second HK gate dielectric layers 134P-136P can have thicknesses similar to or different from each other. In some embodiments, first and second HK gate dielectric layers 134P-136P can be undoped.

In some embodiments, p-type WFM (pWFM) layer 124P can include substantially Al-free (e.g., with no Al) (i) Ti-based nitrides or alloys, such as TiN, TiSiN, titanium gold (Ti—Au) alloy, titanium copper (Ti—Cu) alloy, titanium chromium (Ti—Cr) alloy, titanium cobalt (Ti—Co) alloy, titanium molybdenum (Ti—Mo) alloy, and titanium nickel (Ti—Ni) alloy; (ii) Ta-based nitrides or alloys, such as TaN, TaSiN, Ta—Au alloy, Ta—Cu alloy, Ta—W alloy, tantalum platinum (Ta—Pt) alloy, Ta—Mo alloy, Ta—Ti alloy, and Ta—Ni alloy; or (iii) a combination thereof. In some embodiments, pWFM layer 124P can include a thickness ranging from about 1 nm to about 3 nm. Other suitable dimensions of pWFM layer 124P are within the scope of the present disclosure. Gate metal fill layer 126P can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Referring to FIG. 1C, in some embodiments, gate oxide structure 122N can include (i) an IO layer 128N disposed on fin structure 106N, (ii) a first HK gate dielectric layer 134N disposed on IO layer 128N, (iii) a second HK gate dielectric layer 136N disposed on first HK gate dielectric layer 134N, and (iv) a dipole layer 130N disposed at an interface between IO layer 128N and first HK gate dielectric layer 134N.

IO layer 128N can include an oxide of the material of fin structure 106N, such as silicon oxide ($SiO_2$), silicon germanium oxide ($SiGeO_x$), and germanium oxide ($GeO_x$). In some embodiments, first HK gate dielectric layer 134N can include dopants of metals that have electronegativity values lower than the electronegativity values of metallic or semiconductor materials included in first HK gate dielectric layer 134N. In some embodiments, first HK gate dielectric layer 134N can include dopants of a rare-earth metal, such as Lanthanum (La), Yttrium (Y), Scandium (Sc), Cerium (Ce), Ytterbium (Yb), Erbium (Er), Dysprosium (Dy), and Lutetium (Lu). The metal dopants of first HK gate dielectric layer 134N can induce the formation of n-type dipoles in dipole layer 130N. Dipole layer 130N can include n-type dipoles of metal ions from the metal dopants and oxygen ions from IO layer 128N, such as La—O dipoles, when first HK gate dielectric layer 134N includes La dopants. The lower electronegativity value of the metal dopants of first HK gate dielectric layer 134N can induce stronger n-type dipoles in dipole layer 130N compared to dipoles induced at an interface between IO layer 128N and undoped first HK gate dielectric layer 134N. In some embodiments, first and second HK gate dielectric layers 134N-136N can include high-k dielectric materials similar to first and second HK gate dielectric layers 134P-136P.

In some embodiments, nWFM layer 124N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or a combination thereof. In some embodiments, nWFM layer 124N can include a thickness ranging from about 1 nm to about 3 nm. Other suitable dimensions of nWFM layer 124N are within the scope of the present disclosure. Gate metal fill layer 126N can include a conductive material similar to gate metal fill layer 126P.

Referring to FIG. 1D, in some embodiments, gate oxide structure 122P does not include first and second metal oxide layers 132P-133P and includes first HK gate dielectric layer 135P with dual-metal dopants instead of undoped first HK gate dielectric layer 134P (shown in FIG. 1B). Instead of first and second metal oxide layers 132P-133P, the dual-metal dopants of first HK gate dielectric layer 135P induces the formation of different p-type dipoles in dipole layer 130P. Dipole layer 130P can include p-type dipoles of two different metal ions from the dual-metal dopants of first HK gate dielectric layer 135P and oxygen ions from IO layer 128P. First HK gate dielectric layer 135P can include dopants of metals that have electronegativity values greater than the electronegativity values of metals or semiconductors in first HK gate dielectric layer 135P. In some embodiments, first HK gate dielectric layer 135P can include dopants of materials from group 13 of the periodic table, such as Ga, Al, and In, when first HK gate dielectric layer 135P includes $HfO_2$. In some embodiments, first HK gate dielectric layer 135P can include dopants of transition metals, such as Zn, Nb, Mo, W, and Ta. In some embodiments, dipole layer 130P can include Ga—O and Zn—O dipoles when first HK gate dielectric layer 135P includes Ga and Zn.

In some embodiments, first HK gate dielectric layer 135P can have a higher concentration of transition metal based dopants (e.g., Zn, Nb, Mo, W, or Ta) than group 13 element based dipoles (e.g., Ga, Al, or In) to achieve threshold voltages below about 50 mV (e.g., about 30 mV or 20 mV) as the concentration of dopants is directly proportional to the concentration of dipoles. In contrast, to achieve threshold voltages greater than 50 mV (e.g. about 70 mV or about 100 mV), first HK gate dielectric layer 135P can have a higher concentration of group 13 element based dopants than transition metal based dopants. In some embodiments, first HK gate dielectric layer 135P can include transition metal based dopants and may not include group 13 element based dopants.

Figure 1F:
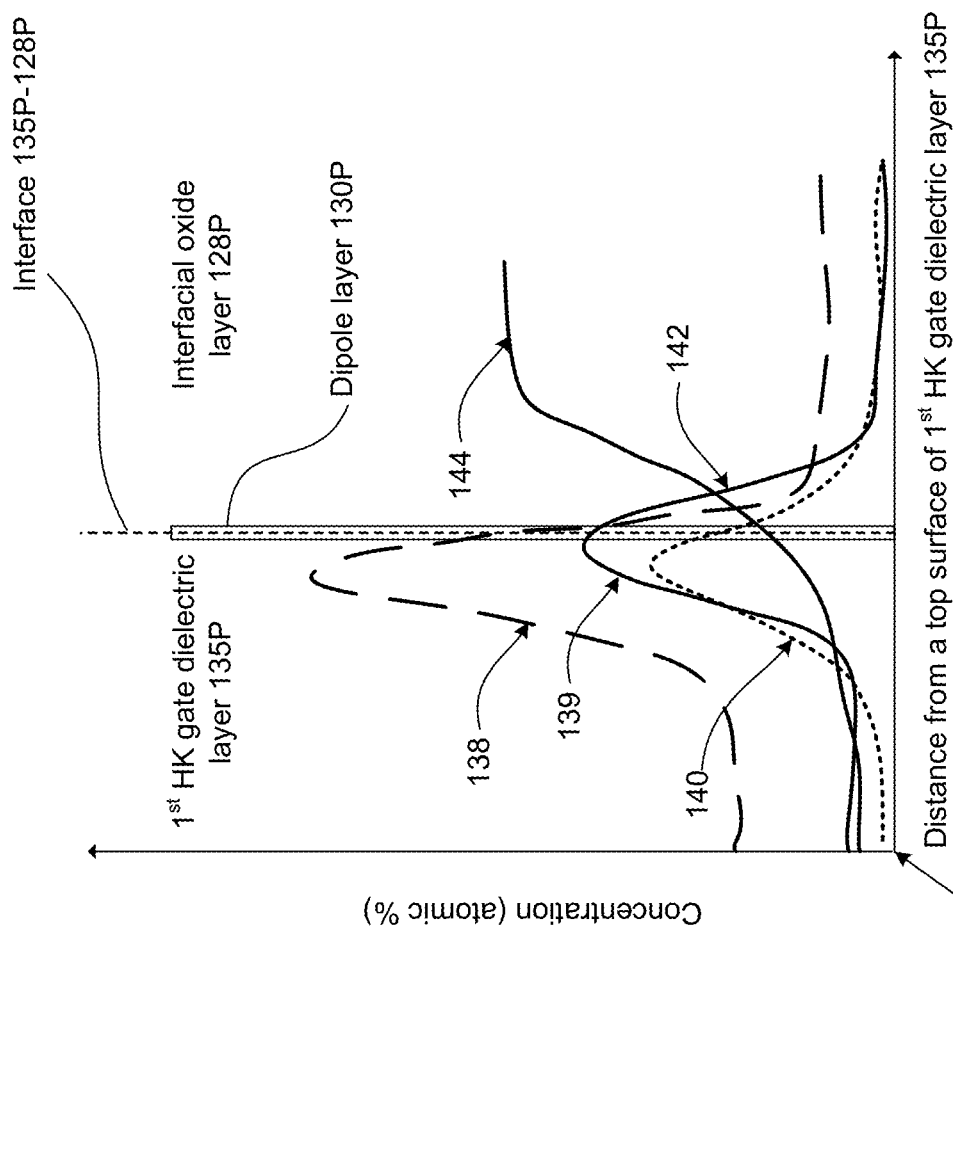
FIG. 1F illustrates device characteristics of a semiconductor device with different gate structures, in accordance with some embodiments.

FIG. 1F shows the Hf, Zn, Ga, $O_2$, and Si concentration profiles 138, 139, 140, 142, and 144 across first HK gate dielectric layer 135P and IO layer 128P along line C-C of FIG. 1D, when first HK gate dielectric layer 135P includes $HfO_2$, and Ga and Zn dopants, and IO layer 128P includes $SiO_2$, according to some embodiments. As shown in FIG. 1F, the peak concentration of Zn dopants (profile 139) is higher than the peak concentration of Ga dopants (profile 140).

Figure 2:
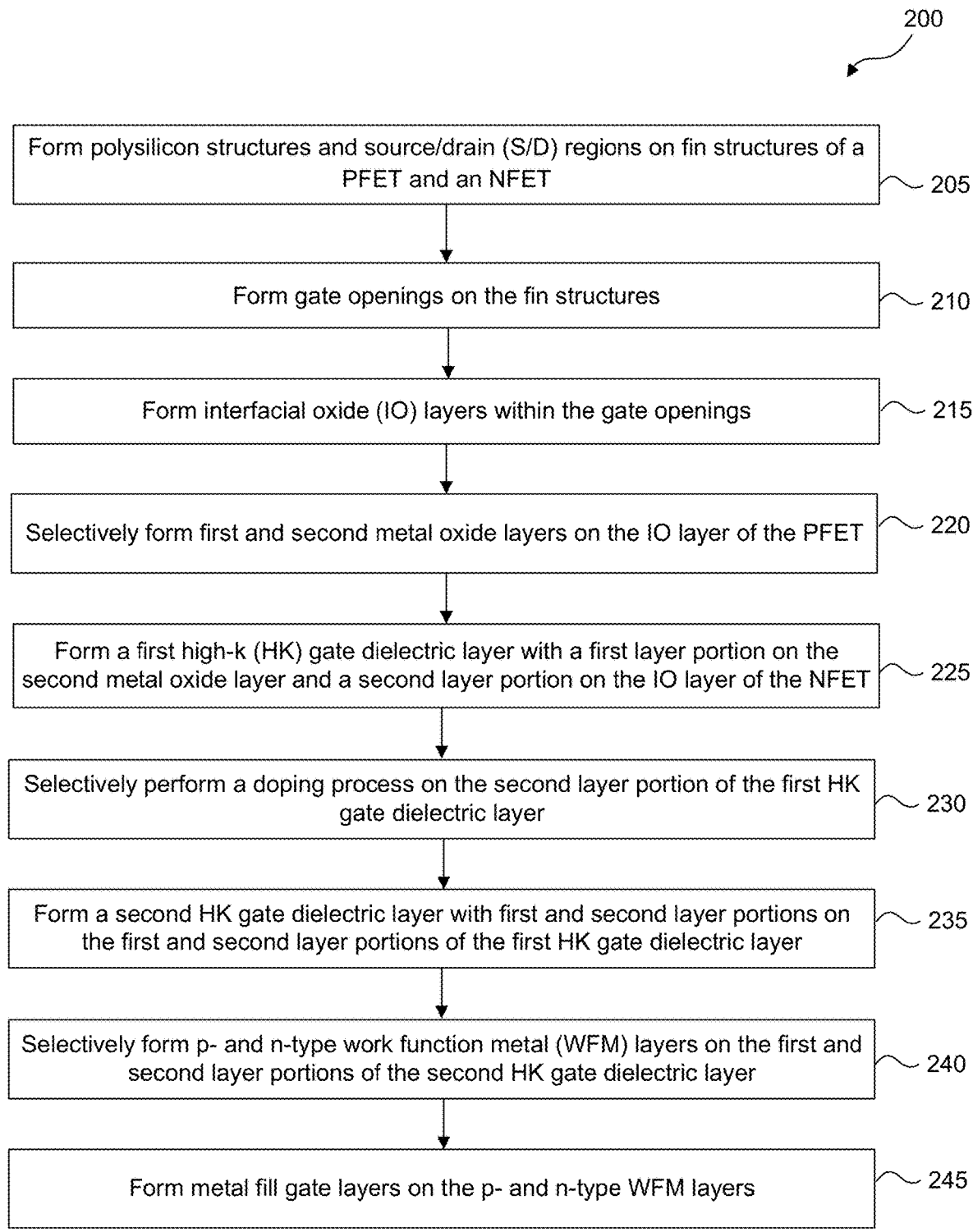
FIG. 2 is a flow diagram of a method for fabricating a semiconductor device with different gate structures, in accordance with some embodiments.
Figure 14B:
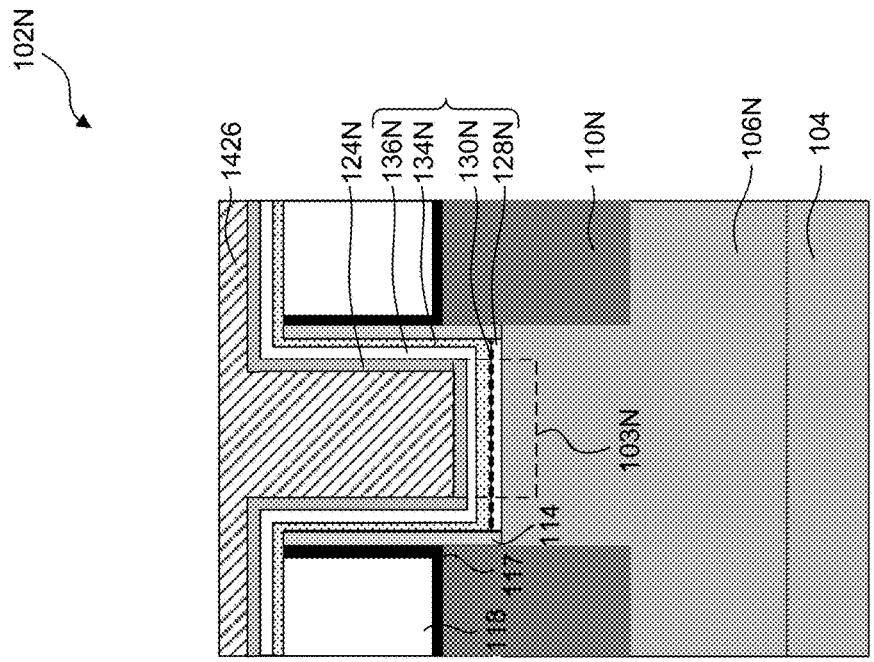
Figure 14A:
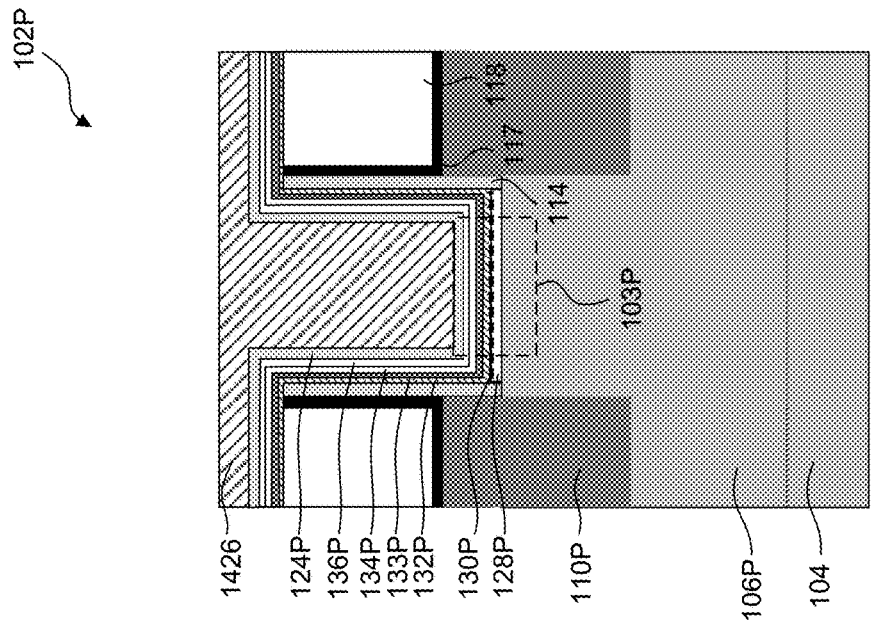

FIG. 2 is a flow diagram of an example method 200 for fabricating PFET-NFET 102P-102N with cross-sections as shown in FIGS. 1B-1C, according to some embodiments. For illustrative purposes, the operations illustrated in FIG. 2 will be described with reference to the example fabrication process for fabricating PFET-NFET 102P-102N as illustrated in FIGS. 3A-15B. FIGS. 3A-15B are cross-sectional views of PFET-NFET 102P-102N along lines A-A and B-B of FIG. 1A at various stages of fabrication, according to various embodiments. Operations can be performed in a different order or not performed depending on specific applications. It should be noted that method 200 may not produce complete PFET-NFET 102P-102N. Accordingly, it is understood that additional processes can be provided before, during, and after method 200, and that some other processes may only be briefly described herein. Elements in FIGS. 3A-15B with the same annotations as elements in FIGS. 1A-1C are described above.

In operation 205, polysilicon structures and S/D regions are formed on fin structures of a PFET and NFET. For example, as shown in FIGS. 3A-3B polysilicon structures 312P-312N and S/D regions 110P-110N are formed on respective fin structure 106P-106N, which are formed on substrate 104. During subsequent processing, polysilicon structures 312P-312N can be replaced in a gate replacement process to form gate structures 112P-112N. After the formation of S/D regions 110P-110N, ESLs 117A and ILD layers 118 can be formed to form the structures of FIGS. 3A-3B.

Referring to FIG. 2, in operation 210, gate openings are formed on the fin structures. For example, as shown in FIGS. 4A-4B, gate openings 412P-412N are formed on respective fin structures 106P-106N. The formation of gate openings 412P-412N can include etching polysilicon structures 312P-312N from the structures of FIGS. 3A-3B.

Referring to FIG. 2, in operations 215-235, gate oxide structures are formed within the gate openings. For example, as described with reference to FIGS. 4A-12B, gate oxide structures 122P-122N (shown in FIGS. 1B-1C) are formed within respective gate openings 412P-412N.

Referring to FIG. 2, in operation 215, 10 layers are formed within the gate openings. For example, as shown in FIGS. 5A-5B, IO layers 128P-128N are formed within gate openings 412P-412N. In some embodiments, IO layers 128P-128N can be formed by exposing the surfaces of fin structures 106P-106N within respective gate openings 412P-412N to an oxidizing ambient. The oxidizing ambient can include a combination of ozone (O3), a mixture of ammonia hydroxide, hydrogen peroxide, and water, and/or a mixture of hydrochloric acid, hydrogen peroxide, water.

The subsequent formation of layers on IO layers 128P-128N in operations 220-240 are described with reference to FIGS. 6A-13B, which are enlarged views of regions 103P-103N shown in respective FIGS. 5A-5B.

Referring to FIG. 2, in operation 220, first and second metal oxide layers are selectively formed on the IO layer of the PFET. For example, as described with reference to FIGS. 6A-7B, first and second metal oxide layers 132P-133P are formed on IO layer 128P. The selective formation of first and second metal oxide layers 132P-133P can include sequential operations of (i) depositing a first metal oxide layer 132 on the structures of FIGS. 5A-5B to form the structures of FIGS. 6A-6B, (ii) depositing a second metal oxide layer 133 on first metal oxide layer 132, as shown in FIGS. 6A-6B, and (iii) selectively removing the portions of first and second metal oxide layers 132-133 on IO layer 128N by using a lithographic patterning process on the structures of FIGS. 6A-6B to form the structures of FIGS. 7A-7B. Dipole layer 130P induced between first metal oxide layer 132 and IO layer 128N is removed when the portions of first and second metal oxide layers 132-133 on IO layer 128N are removed. The deposition of first and second metal oxide layers 132-133 can include depositing about 0.5 nm to about 3 nm layers of oxides of metals (e.g., Ga, Al, In, Zn, Nb, Mo, W, or Ta) that have electronegativity values greater than the electronegativity values of metals or semiconductors (e.g., Hf, Zr, or Ti) in first HK gate dielectric layer 134P. In addition, the layers of oxides (e.g., $Ga_2O_3$, $Al_2O_3$, $In_2O_3$, ZnO, $NbO_2$, $MoO_2$, $WO_3$, or $Ta_2O_5$) can have an oxygen areal density greater than the oxygen areal density of the oxide material (e.g., $HfO_2$, $ZrO_2$, or $TiO_2$) in first HK gate dielectric layer 134P. In some embodiments, the deposition of first oxide metal layer 132 includes depositing a layer of transition metal oxide (e.g., ZnO, $NbO_2$, $MoO_2$, $WO_3$, or $Ta_2O_5$) and the deposition of second metal oxide layer 133 includes depositing a layer of oxide (e.g., $Ga_2O_3$, $Al_2O_3$, $In_2O_3$) of a metal from group 13 of the periodic table.

Referring to FIG. 2, in operation 225, a first HK gate dielectric layer with a first layer portion on the second metal oxide layer and a second layer portion on the IO layer of the NFET is formed. For example, as shown in FIGS. 8A-8B, a first HK gate dielectric layer with a first layer portion 134P (also referred to as "first HK gate dielectric layer 134P") on second metal oxide layer 133P and a second layer portion 134N* (also referred to as "first HK gate dielectric layer 134N*") on IO layer 128N is formed. In some embodiments, first HK gate dielectric layers 134P-134N* can be formed by depositing about 1 nm to about 2 nm of $HfO_2$ with an atomic layer deposition (ALD) process using hafnium chloride ($HfCl_4$) as a precursor at a temperature ranging from about 250° C. to about 350° C.

Referring to FIG. 2, in operation 230, a doping process is selectively performed on the second layer portion of the first HK gate dielectric layer. For example, as described with reference to FIGS. 9A-11B, a doping process is selectively performed on first HK gate dielectric layer 134N*. The selective doping process can include sequential operations of (i) depositing a dopant source layer 946 on the structures of FIGS. 8A-8B to form the structures of FIGS. 9A-9B, (ii) selectively removing the portion of dopant source layer 946 on first HK gate dielectric layer 134P by using a lithographic patterning process on the structures of FIGS. 9A-9B to form the structures of FIGS. 10A-10B, (iii) performing a drive-in anneal process on the structures of FIGS. 10A-10B to form doped first HK gate dielectric layer 134N and dipole layer 130N, as shown in FIG. 11B, and (iv) removing dopant source layer 946 from the structure of FIG. 10B to form the structures of FIGS. 11A-11B.

The drive-in anneal process can implant metal dopants into first HK gate dielectric layer 134N* through diffusion of metal atoms from dopant source layer 946 into first HK gate dielectric layer 134N*. The implanted metal dopants can induce the formation of dipole layer 130N. The drive-in anneal process can include annealing the structures of FIGS. 10A-10B at a temperature from about 600° C. to about 800° C. and at a pressure from about 1 torr to about 50 torr for a time period ranging from about 0.1 second to about 30 seconds. In some embodiments, the drive-in anneal process can include two anneal processes: (i) a soak anneal process at a temperature from about 600° C. to about 800° C. and at a pressure from about 1 torr to about 50 torr for a time period ranging from about 2 sec to about 60 sec, and (ii) a spike anneal process at a temperature from about 700° C. to about 800° C. for a time period ranging from about 0.1 second to about 2 seconds.

The deposition of dopant source layer 946 can include depositing a layer of oxide of a rare-earth metal (e.g., La, Y, Sc, Ce, Yb, Er, Dy, or Lu) that has an electronegativity value lower than the electronegativity values of metallic or semiconductor materials (e.g., Hf, Zr, or Ti) included in first HK gate dielectric layer 134N. In addition, the layer of oxide (e.g., lanthanum oxide ($La_2O_3$), yttrium oxide ($Y_2O_3$), scandium oxide ($Sc_2O_3$), cerium oxide ($CeO_2$), ytterbium oxide ($Yb_2O_3$), erbium oxide ($Er_2O_3$), dysprosium oxide ($Dy_2O_3$), or lutetium oxide ($Lu_2O_3$)) can have an oxygen areal density smaller than the oxygen areal density of the oxide material (e.g., $HfO_2$, $ZrO_2$, or $TiO_2$) included in first HK gate dielectric layer 134N.

Referring to FIG. 2, in operation 235, a second HK gate dielectric layer with first and second layer portions on the first and second layer portions of the first HK gate dielectric layer is formed. For example, as shown in FIGS. 12A-12B, a second HK gate dielectric layer with a first layer portion 136P (also referred to as "second HK gate dielectric layer 136P") on first HK gate dielectric layer 134P and a second layer portion 136N (also referred to as "second HK gate dielectric layer 136N") on first HK gate dielectric layer 134N is formed. In some embodiments, second HK gate dielectric layers 136P-136N can be formed by depositing about 5 nm to about 8 nm of $HfO_2$ with an atomic layer deposition (ALD) process using hafnium chloride ($HfCl_4$) as a precursor at a temperature ranging from about 250° C. to about 350° C. In some embodiments, second HK gate dielectric layers 136P-136N can be deposited thicker than first HK gate dielectric layers 134P-134N.

Referring to FIG. 2, in operation 240, a pWFM layer is selectively formed on the first layer portion of the second HK gate dielectric layer and an nWFM layer is selectively formed on the second layer portion of the second HK gate dielectric layer. For example, as shown in FIGS. 13A-13B, pWFM layer 124P is selectively formed on second HK gate dielectric layer 136P and nWFM layer 124N is selectively formed on second HK gate dielectric layer 136N. The selective formation of pWFM 124P and nWFM layers 124N can be performed on the structures of FIGS. 12A-12B using lithographic patterning processes to form the structures of FIGS. 13A-13B.

Referring to FIG. 2, in operation 245, gate metal fill layers are formed on the pWFM layer and the nWFM layer. For example, as described with reference to FIGS. 14A-15B, gate metal fill layers 126P and 126N are formed on respective pWFM layer 124P and nWFM layer 124N. The formation of gate metal fill layers 126P-126N can include sequential operations of (i) depositing a conductive layer 1426 on the structures of FIGS. 13A-13B to fill gate openings 412P-412N and form the structures of FIGS. 14A-14B, and (ii) performing a chemical mechanical polishing (CMP) process on the structures of FIGS. 14A-14B to form the structures of FIGS. 15A-15B with top surfaces of gate structures 112P-112N substantially coplanar with a top surface of ILD layer 118. In some embodiments, after the CMP process, gate capping layers (not shown) on gate structures 112P-112N and contact structures on gate structures 112P-112N and S/D regions 110P-110N can be formed.

Figure 16:
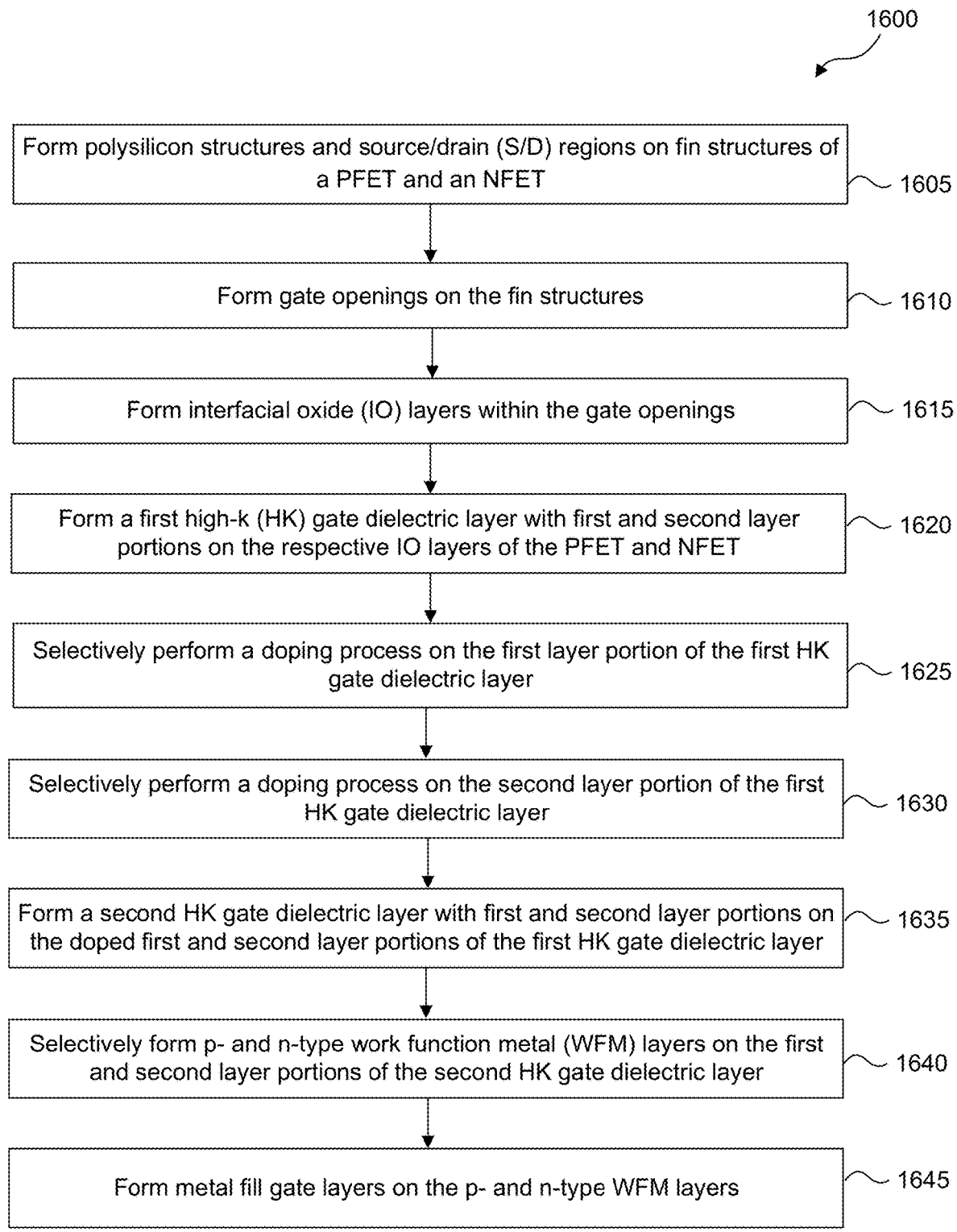
FIG. 16 is a flow diagram of a method for fabricating a semiconductor device with different gate structures, in accordance with some embodiments.
Figure 26B:
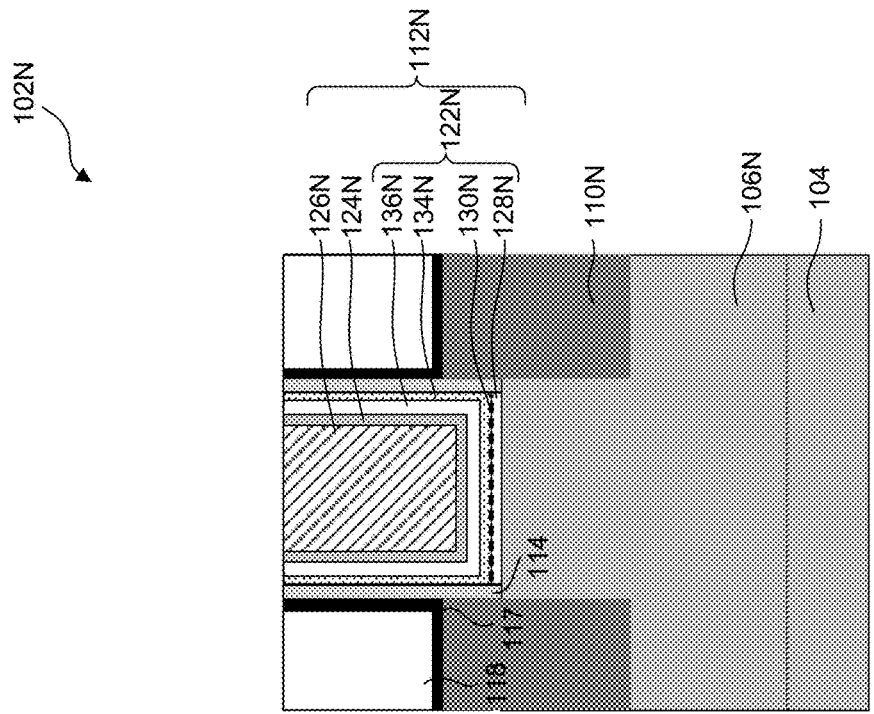
Figure 26A:
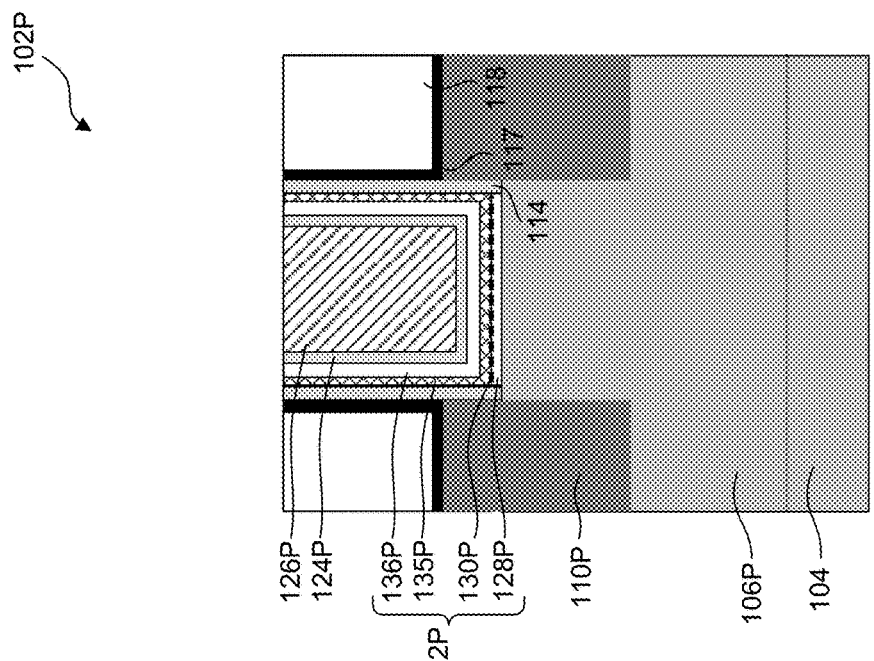

FIG. 16 is a flow diagram of an example method 1600 for fabricating PFET-NFET 102P-102N with cross-sections as shown in FIGS. 1D-1E, according to some embodiments. For illustrative purposes, the operations illustrated in FIG. 16 will be described with reference to the example fabrication process for fabricating PFET-NFET 102P-102N as illustrated in FIGS. 17A-26B. FIGS. 17A-26B are cross-sectional views of PFET-NFET 102P-102N along lines A-A and B-B of FIG. 1A at various stages of fabrication, according to various embodiments. Operations can be performed in a different order or not performed depending on specific applications. It should be noted that method 1600 may not produce complete PFET-NFET 102P-102N. Accordingly, it is understood that additional processes can be provided before, during, and after method 1600, and that some other processes may only be briefly described herein. Elements in FIGS. 17A-26B with the same annotations as elements in FIGS. 1A-1E are described above.

Referring to FIG. 16, operations 1605-1615 are similar to operations 205-215 of FIG. 2. After operation 1615, structures similar to the structures of FIGS. 5A-5B are formed. The subsequent formation of layers on IO layers 128P-128N (shown in FIGS. 5A-5B) in operations 1620-1640 are described with reference to FIGS. 17A-24B, which are enlarged views of regions 103P-103N shown in respective FIGS. 5A-5B.

Referring to FIG. 16, in operations 1615-1635, gate oxide structures are formed within the gate openings. For example, as described with reference to FIGS. 17A-23B, gate oxide structures 122P-122N (shown in FIGS. 1D-1E) are formed within respective gate openings 412P-412N (shown in FIGS. 4A-4B).

Referring to FIG. 16, in operation 1620, a first HK gate dielectric layer with first and second layer portions on respective IO layers of the PFET and NFET 15 formed. For example, as shown in FIGS. 17A-17B, a first HK gate dielectric layer with a first layer portion 134P\* on IO layer 128P and a second layer portion 134N\* on IO layer 128N is formed. In some embodiments, first and second layer portions **134P\*-134N\*** can be formed by depositing about 1 nm to about 2 nm of $HfO_2$ with an atomic layer deposition (ALD) process using hafnium chloride ($HfCl_4$) as a precursor at a temperature ranging from about 250° C. to about 350° C.

Referring to FIG. 16, in operation 1625, a doping process is selectively performed on the first layer portion of the first HK gate dielectric layer. For example, as described with reference to FIGS. 18A-20B, a doping process is selectively performed on first layer portion 134P\*. The selective doping process can include sequential operations of (i) depositing a first dopant source layer 1848 on the structures of FIGS. 17A-17B, as shown in FIGS. 18A-18B, (ii) depositing a second dopant source layer 1850 on first dopant source layer 1848, as shown in FIGS. 18A-18B, (iii) selectively removing the portions of first and second dopant source layers 1848-1850 on second layer portion 134N\* by using a lithographic patterning process on the structures of FIGS. 18A-18B to form the structures of FIGS. 19A-19B, (iv) performing a drive-in anneal process on the structures of FIGS. 19A-19B to form doped first HK gate dielectric layer 135P and dipole layer 130P, as shown in FIG. 20A, and (v) removing first and second dopant source layers 1848-1850 from the structure of FIG. 19 to form the structures of FIGS. 20A-20B.

The drive-in anneal process can implant metal dopants into first layer portion 134P\* through diffusion of metal atoms from first and second dopant source layers 1848-1850 into first layer portion 134P\*. The implanted metal dopants can induce the formation of dipole layer 130P. The drive-in anneal process can include annealing the structures of FIGS. 19A-19B at a temperature from about 600° C. to about 800° C. and at a pressure from about 1 torr to about 50 torr for a time period ranging from about 0.1 second to about 30 seconds. In some embodiments, the drive-in anneal process can include two anneal processes: (i) a soak anneal process at a temperature from about 600° C. to about 800° C. for a time period ranging from about 2 sec to about 60 sec and (ii) a spike anneal process at a temperature from about 700° C. to about 800° C. for a time period ranging from about 0.1 second to about 2 seconds.

Figure 27:
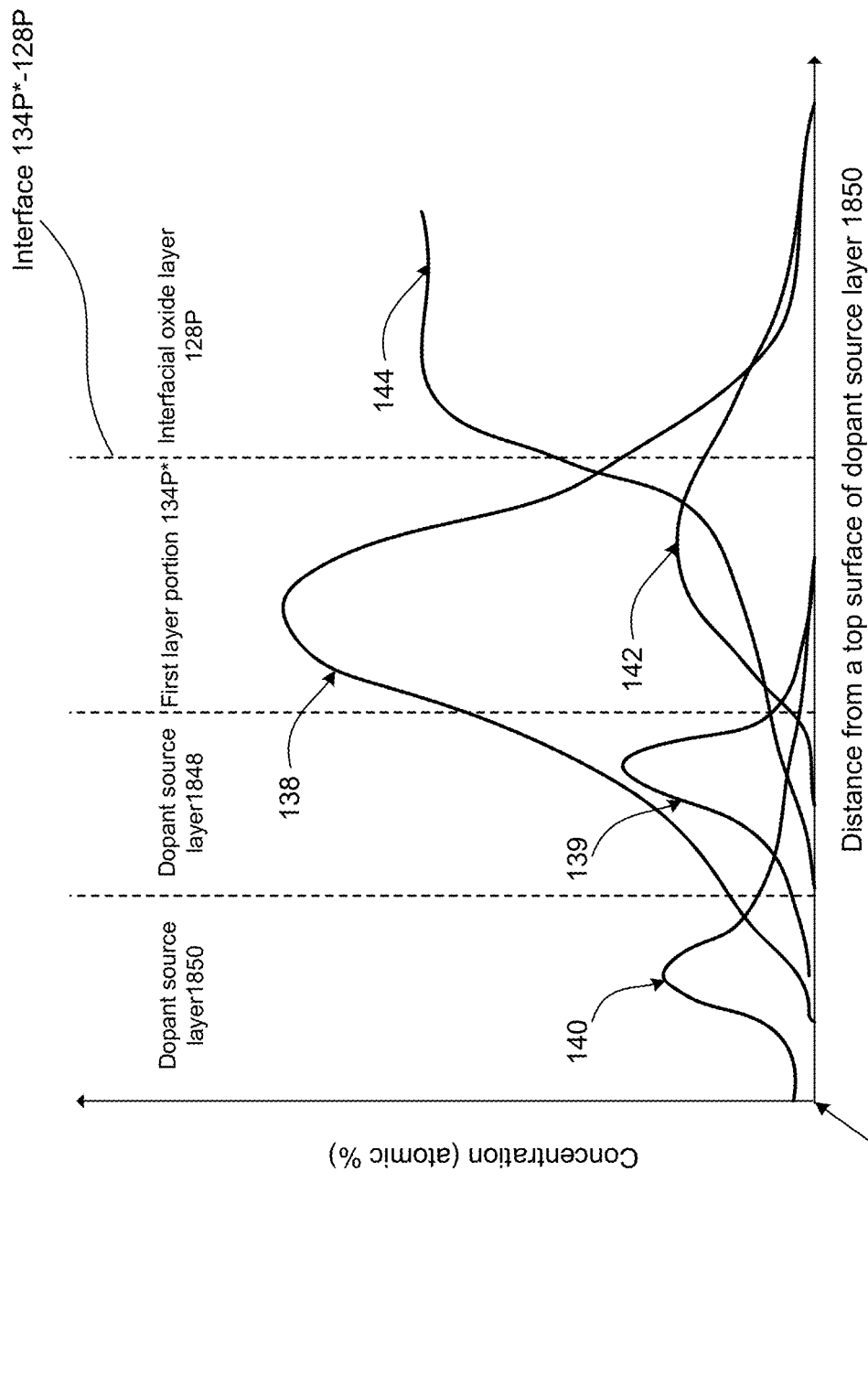
FIGS. 27-28 illustrates device characteristics of a semiconductor device with different gate structures at various stages of its fabrication process, in accordance with some embodiments.
Figure 28:
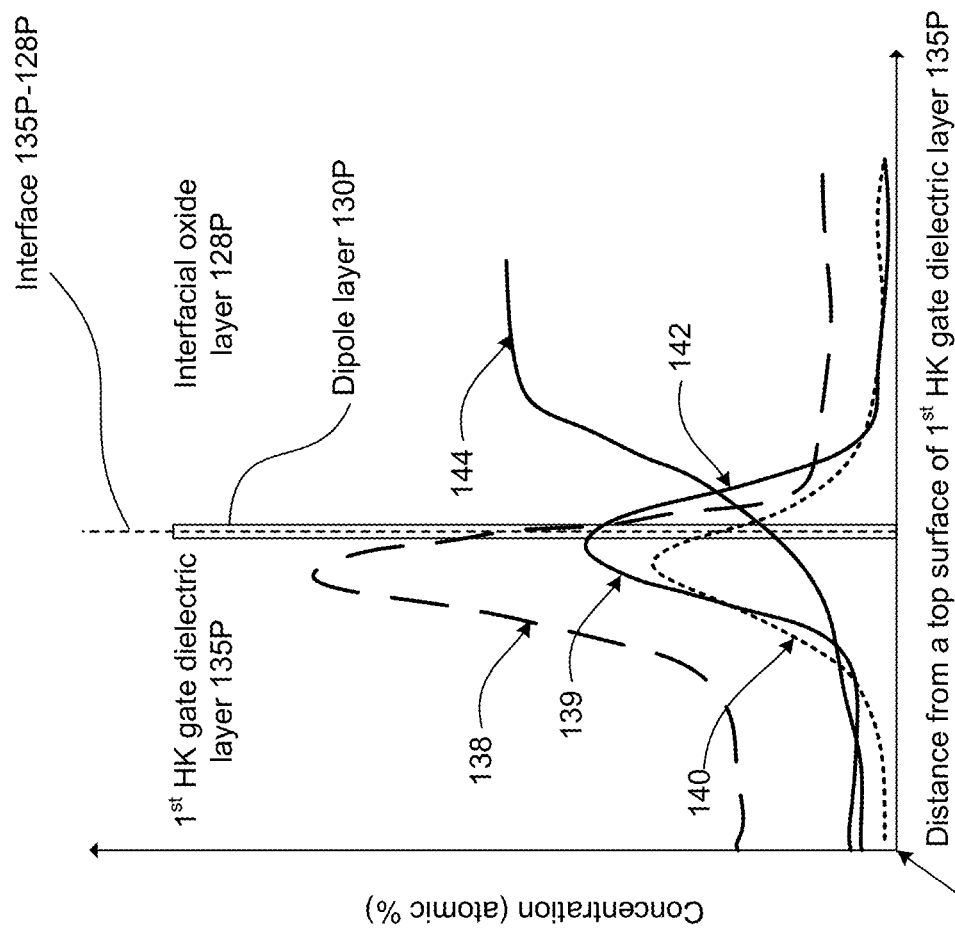

FIG. 27 shows the Hf, Zn, Ga, $O_2$, and Si concentration profiles 138, 139, 140, 142, and 144 along line D-D of FIG. 19A before the drive-in anneal process, when first layer portion 134P\* includes $HfO_2$, first dopant source layer 1848 includes ZnO, second dopant source layer 1850 includes $Ga_2O_3$, and IO layer 128P includes $SiO_2$, according to some embodiments. FIG. 28 shows the Hf, Zn, Ga, $O_2$, and Si concentration profiles 138, 139, 140, 142, and 144 along line D-D of FIG. 19A after the drive-in anneal process. Prior to the drive-in anneal process, the peak concentrations of Zn and Ga atoms are within the respective regions of first and second dopant source layers 1848 and 1850, as shown in FIG. 27. Following the drive-in anneal process, the peak concentrations of Zn and Ga atoms shifts to the region of first HK gate dielectric layer 135P, as shown in FIG. 28, thus indicating the implantation of Zn and Ga dopants in first HK gate dielectric layer 135P. The peak concentration of Zn atoms in first HK gate dielectric layer 135P is higher and closer to interface 135P-128P than the peak concentration of Ga atoms in first HK gate dielectric layer 135P. Such difference between the peak concentrations of Zn and Ga atoms can be achieved by (i) using first dopant source layer 1848 with higher concentration of Zn atoms than the concentration of Ga atoms in second dopant source layer 1850, and (ii) depositing first dopant source layer 1848 closer to first layer 134P\* than second dopant source layer 1850 to achieve threshold voltages below about 50 mV (e.g., about 30 mV or 20 mV).

The deposition of first and second dopant source layers 1848-1850 can include depositing layers of oxides of metals (e.g., Zn, Nb, Mo, W, Ta, Ga, Al, or In) that have electronegativity values greater than the electronegativity values of metals or semiconductors (e.g., Hf, Zr, or Ti) in first HK gate dielectric layer 135P. In addition, the layers of oxides (e.g., ZnO, $NbO_2$, $MoO_2$, $WO_3$, or $Ta_2O_5$, $Ga_2O_3$, $Al_2O_3$, or $In_2O_3$) can have oxygen areal densities greater than the oxygen areal density of the oxide material (e.g., $HfO_2$, $ZrO_2$, or $TiO_2$) in first HK gate dielectric layer 135P. The deposition of first and second dopant source layers 1848-1850 can include depositing layers of oxides different from each other. In some embodiments, second dopant source layer 1850 may not be deposited to dope first HK gate dielectric layer with the same metal dopants. In some embodiments, a nitride capping layer (not shown) can be deposited on second dopant source layer 1850 or on first dopant source layer 1848 in the absence of second dopant source layer 1850 to protect the underlying layers from thermal degradation during the drive-in anneal process.

Referring to FIG. 16, in operation 1630, a doping process is selectively performed on the second layer portion of the first HK gate dielectric layer. For example, as described with reference to FIGS. 21A-23B, a doping process is selectively performed on second layer portion 134N\*. The selective doping process can include sequential operations of (i) depositing a dopant source layer 946 on the structures of FIGS. 20A-20B to form the structures of FIGS. 21A-21B, (ii) selectively removing the portion of dopant source layer 946 on first HK gate dielectric layer 135P by using a lithographic patterning process on the structures of FIGS.

21A-21B to form the structures of FIGS. 22A-22B, (iii) performing a drive-in anneal process on the structures of FIGS. 22A-22B to form doped first HK gate dielectric layer 134N and dipole layer 130N, as shown in FIG. 23B, and (iv) removing dopant source layer 946 from the structure of FIG. 22B. The deposition of dopant source layer 946 and the drive-in anneal process is similar to those described in operation 230.

Referring to FIG. 16, in operation 1635, a second HK gate dielectric layer with first and second layer portions on the doped first and second layer portions of the first HK gate dielectric layer is formed. For example, as shown in FIGS. 23A-23B, a second HK gate dielectric layer with a first layer portion 136P (also referred to as "second HK gate dielectric layer 136P") on first HK gate dielectric layer 135P and a second layer portion 136N (also referred to as "second HK gate dielectric layer 136N") on first HK gate dielectric layer 134N is formed. Second HK gate dielectric layers 136P-136N can be formed in an operation similar to that described in operation 235.

Referring to FIG. 16, in operation 1640, a pWFM layer is selectively formed on the first layer portion of the second HK gate dielectric layer and an nWFM layer is selectively formed on the second layer portion of the second HK gate dielectric layer. For example, as shown in FIGS. 24A-24B, pWFM layer 124P is selectively formed on second HK gate dielectric layer 136P and nWFM layer 124N is selectively formed on second HK gate dielectric layer 136N. The selective formation of pWFM 124P and nWFM layers 124N can be performed on the structures of FIGS. 23A-23B using lithographic patterning processes to form the structures of FIGS. 24A-24B.

Referring to FIG. 16, in operation 1645, gate metal fill layers are formed on the pWFM layer and the nWFM layer. For example, as described with reference to FIGS. 25A-26B, gate metal fill layers 126P and 126N are formed on respective pWFM layer 124P and nWFM layer 124N. The formation of gate metal fill layers 126P-126N is similar to that described in operation 245.

The present disclosure provides example multi-Vt devices with FETs (e.g., PFET 102P and NFET 102N) having ultra-low threshold voltages (e.g., about 20 mV to about 100 mV) different from each other and provides example methods of forming such FETs on the same substrate. The example methods form NFETs and PFETs with WFM layers (e.g., pWFM layer 124P and nWFM layer 124N) of similar thicknesses, but with ultra-low and/or different threshold voltages, on the same substrate. These example methods can be more cost-effective (e.g., cost reduced by about 20% to about 30%) and time-efficient (e.g., time reduced by about 15% to about 20%) in manufacturing reliable FET gate structures with lower and/or different threshold voltages than other methods of forming FETs with similar dimensions and threshold voltages on the same substrate. In addition, these example methods can form FET gate structures with much smaller dimensions (e.g., thinner gate stacks) than other methods of forming FETs with similar threshold voltages.

In some embodiments, NFETs and PFETs with different gate structure configurations (e.g., gate structures 112P-112N), but with similar WFM layer thicknesses, can be selectively formed on the same substrate to achieve ultra-low and/or different threshold voltages. The different gate structures can have HK gate dielectric layers (e.g., HK gate dielectric layers 135P and 134N) doped with different metallic dopants. The different metal dopants can induce dipoles of different polarities and/or concentrations in dipole layers (e.g., dipole layers 130P-130N) at interfaces between the HK gate dielectric layers and IO layers. The dipoles of different polarities and/or concentrations result in gate structures with different EWF values and threshold voltages. In some embodiments, HK gate dielectric layers can be doped with dopants of two different materials to induce dipoles of different materials that provide stronger electric fields and lower threshold voltages. Thus, controlling the dopant materials and/or concentrations in the HK gate dielectric layers can tune the EWF values of the NFET and PFET gate structures, and as a result can adjust the threshold voltages of the NFETs and PFETs without varying the WFM layer thicknesses. In some embodiments, instead of the doped HK gate dielectric layer, PFET gate structure can include dual metal oxide layers (e.g., first and second metal oxide layers 132P-133P) interposed between the HK gate dielectric and the IO layer to induce dipoles of different materials between the HK gate dielectric layer and the IO layer.

In some embodiments, a method includes forming a fin structure on a substrate, forming a gate opening on the fin structure, forming an interfacial oxide layer on the fin structure, forming a first dielectric layer over the interfacial oxide layer, forming a dipole layer between the interfacial oxide layer and the first dielectric layer, forming a second dielectric layer on the first dielectric layer, forming a work function metal (WFM) layer on the second dielectric layer, and forming a gate metal fill layer on the WFM layer. The dipole layer includes ions of first and second metals that are different from each other. The first and second metals have electronegativity values greater than an electronegativity value of a metal or a semiconductor of the first dielectric layer.

In some embodiments, a method includes forming first and second fin structures on a substrate, forming first and second gate openings on the first and second fin structures, respectively, forming a first dielectric layer with first and second layer portions formed within the first and second gate openings, respectively, selectively doping the first layer portion with first and second dopants that are different from each other, selectively doping the second layer portion with third dopants different from the first and second dopants, forming a second dielectric layer with first and second layer portions on the first and second layer portions of the first dielectric layer, and forming first and second gate metal fill layers over the first and second layer portions of the second dielectric layer, respectively. The first and second dopants have electronegativity values greater than an electronegativity value of a metal or a semiconductor of the first dielectric layer. The third dopants have an electronegativity value less than an electronegativity value of the metal or the semiconductor of the first dielectric layer.

In some embodiments, a semiconductor device includes a substrate, a fin structure disposed on the substrate, a semiconductor oxide layer disposed on the fin structure, a first metal oxide layer disposed on the semiconductor oxide layer, a second metal oxide layer disposed on the first metal oxide layer, a first dielectric layer disposed on the second metal oxide layer, a second dielectric layer disposed on the first dielectric layer, a work function metal (WFM) layer disposed on the second dielectric layer, and a gate metal fill layer on the WFM layer. The second metal oxide layer is different from the first metal oxide layer. Metals of the first and second metal oxide layers have electronegativity values greater than an electronegativity value of a metal or a semiconductor the first dielectric layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure on a substrate;
    forming a gate opening on the fin structure;
    forming an interfacial oxide layer on the fin structure;
    forming a first dielectric layer over the interfacial oxide layer;
    forming a dipole layer between the interfacial oxide layer and the first dielectric layer, wherein the dipole layer comprises ions of first and second metals that are different from each other, and wherein the first and second metals have electronegativity values greater than an electronegativity value of a metal or a semiconductor of the first dielectric layer;
    forming a second dielectric layer on the first dielectric layer;
    forming a work function metal (WFM) layer on the second dielectric layer; and
    forming a gate metal fill layer on the WFM layer.

2. The method of claim 1, wherein the forming the dipole layer comprises:
    forming a first metal oxide layer on the interfacial oxide layer; and
    forming a second metal oxide layer on the first metal oxide layer, wherein the second metal oxide layer is different from the first metal oxide layer.

3. The method of claim 2, wherein the forming the first or second metal oxide layer comprises depositing an oxide of a metal that is different from a metal of the second dielectric layer.

4. The method of claim 2, wherein the forming the first or second metal oxide layer comprises depositing an oxide of zinc, niobium, molybdenum, tungsten, tantalum, gallium, aluminum, or indium.

5. The method of claim 2, wherein the forming the first metal oxide layer comprises depositing an oxide of zinc, niobium, molybdenum, tungsten, or tantalum, and
    wherein the forming the second metal oxide layer comprises depositing an oxide of gallium, aluminum, or indium.

6. The method of claim 1, wherein the forming the dipole layer comprises depositing first and second metal oxide layers on the interfacial oxide layer, and wherein the first and second metal oxide layers have oxygen areal densities greater than an oxygen areal density of the first dielectric layer.

7. The method of claim 1, wherein the forming the dipole layer comprises forming first and second dipoles with first and second concentrations that are different from each other.

8. The method of claim 1, wherein the forming the dipole layer comprises:
    depositing a first layer of metal oxide with a first thickness,
    depositing a second layer of metal oxide with a second thickness that is less than the first thickness, and
    wherein the first and second layers of metal oxides have metals different from each other.

9. A method, comprising:
    forming first and second fin structures on a substrate;
    forming first and second gate openings on the first and second fin structures, respectively;
    forming a first dielectric layer with first and second layer portions formed within the first and second gate openings, respectively;
    selectively doping the first layer portion with first and second dopants that are different from each other, wherein the first and second dopants have electronegativity values greater than an electronegativity value of a metal or a semiconductor of the first dielectric layer;
    selectively doping the second layer portion with third dopants different from the first and second dopants, wherein the third dopants have an electronegativity value less than an electronegativity value of the metal or the semiconductor of the first dielectric layer;
    forming a second dielectric layer with first and second layer portions on the first and second layer portions of the first dielectric layer; and
    forming first and second gate metal fill layers over the first and second layer portions of the second dielectric layer, respectively.

10. The method of claim 9, wherein the selectively doping the first layer portion with the first and second dopants comprises:
    forming first and second dopant source layers on the first and second layer portions of the first dielectric layer;
    removing portions of the first and second dopant source layers on the second layer portion of the first dielectric layer; and
    performing an annealing process.

11. The method of claim 10, wherein the forming the first or second dopant source layer comprises depositing an oxide material with an oxygen areal density greater than an oxygen areal density of an oxide material of the first dielectric layer.

12. The method of claim 10, wherein the forming the first or second dopant source layer comprises depositing an oxide of zinc, niobium, molybdenum, tungsten, tantalum, gallium, aluminum, or indium.

13. The method of claim 10, wherein the forming the first dopant source layer comprises depositing an oxide of zinc, niobium, molybdenum, tungsten, or tantalum, and
    wherein the forming the second dopant source layer comprises depositing an oxide of gallium, aluminum, or indium.

14. The method of claim 10, wherein the forming the first dopant source layer comprises depositing a first layer of metal oxide with a first thickness,
    wherein the forming the second dopant source layer comprises depositing a second layer of metal oxide with a second thickness that is less than the first thickness, and
    wherein the first and second layers of metal oxides have metals different from each other.

15. The method of claim 9, wherein the selectively doping the second layer portion with the third dopants comprises:
    forming a rare-earth metal oxide layer on the first and second layer portions of the first dielectric layer;
    removing a portion of the rare-earth metal oxide layer on the first layer portion of the first dielectric layer; and
    performing an annealing process.

16. The method of claim 15, wherein the forming the rare-earth metal oxide layer comprises depositing an oxide material with an oxygen areal density less than an oxygen areal density of an oxide material of the first dielectric layer.

17. A semiconductor device, comprising:
a substrate;
a fin structure disposed on the substrate;
a semiconductor oxide layer disposed on the fin structure;
a first metal oxide layer disposed on the semiconductor oxide layer;
a second metal oxide layer disposed on the first metal oxide layer, wherein the second metal oxide layer is different from the first metal oxide layer;
a first dielectric layer disposed on the second metal oxide layer, wherein metals of the first and second metal oxide layers have electronegativity values greater than an electronegativity value of a metal or a semiconductor of the first dielectric layer;
a second dielectric layer disposed on the first dielectric layer;
a work function metal (WFM) layer disposed on the second dielectric layer; and
a gate metal fill layer on the WFM layer.

18. The semiconductor device of claim 17, further comprising a dipole layer disposed at an interface between the first metal oxide layer and the semiconductor oxide layer.

19. The semiconductor device of claim 18, wherein the dipole layer comprises metal atoms of the first and second metal oxide layers and oxygen atoms of the semiconductor oxide layer.

20. The semiconductor device of claim 17, wherein oxygen areal densities of the first and second metal oxide layers are greater than an oxygen areal density of the first dielectric layer.

* * * * *